(12) United States Patent
Kim et al.

(10) Patent No.: US 11,075,321 B2
(45) Date of Patent: Jul. 27, 2021

(54) SEMICONDUCTOR DEVICE

(71) Applicant: SUZHOU LEKIN SEMICONDUCTOR CO., LTD., Taicang (CN)

(72) Inventors: Hyun Ju Kim, Seoul (KR); Hyung Jo Park, Seoul (KR); Hwan Kyo Kim, Seoul (KR)

(73) Assignee: SUZHOU LEKIN SEMICONDUCTOR CO., LTD., Taicang (CN)

( * ) Notice: Subject to any disclaimer, the term of this patent is extended or adjusted under 35 U.S.C. 154(b) by 0 days.

(21) Appl. No.: 16/231,776

(22) Filed: Dec. 24, 2018

(65) Prior Publication Data

US 2019/0198711 A1  Jun. 27, 2019

(30) Foreign Application Priority Data

Dec. 27, 2017 (KR) .................. 10-2017-0181407
May 16, 2018 (KR) .................. 10-2018-0056203

(51) Int. Cl.
*H01L 33/10* (2010.01)
*H01L 33/20* (2010.01)
(Continued)

(52) U.S. Cl.
CPC .............. *H01L 33/10* (2013.01); *H01L 24/05* (2013.01); *H01L 33/0093* (2020.05);
(Continued)

(58) Field of Classification Search
CPC ................................ H01L 33/08; H01L 33/20
See application file for complete search history.

(56) References Cited

U.S. PATENT DOCUMENTS

2005/0281303 A1  12/2005  Horio et al.
2006/0124954 A1   6/2006  Akaishi
(Continued)

FOREIGN PATENT DOCUMENTS

WO   WO 2017/034356   3/2017

OTHER PUBLICATIONS

European Search Report dated Feb. 27, 2019 issued in Application No. 18215820.4.

*Primary Examiner* — Yu-Hsi D Sun
(74) *Attorney, Agent, or Firm* — Birch, Stewart, Kolasch & Birch, LLP

(57) ABSTRACT

Exemplary embodiments provide a semiconductor device including: a semiconductor structure which includes a first-conductive-type semiconductor layer, a second-conductive-type semiconductor layer, and an active layer disposed between the first-conductive-type semiconductor layer and the second-conductive-type semiconductor layer, wherein the semiconductor structure has a first recess passing through the second-conductive-type semiconductor layer, the active layer and a first portion of the first-conductive-type semiconductor layer; and a plurality of second recesses passing through the second-conductive-type semiconductor layer, the active layer and a second portion of the first-conductive-type semiconductor layer, wherein the first recess is disposed along an outer surface of the semiconductor structure, wherein the plurality of second recesses are surrounded by the first recess.

9 Claims, 26 Drawing Sheets

(51) Int. Cl.
  *H01L 33/62* (2010.01)
  *H01L 23/00* (2006.01)
  *H01L 33/36* (2010.01)
  *H01L 33/38* (2010.01)
  *H01L 33/44* (2010.01)
  *H01L 33/08* (2010.01)
  *H01L 33/00* (2010.01)

(52) U.S. Cl.
  CPC .............. *H01L 33/08* (2013.01); *H01L 33/20* (2013.01); *H01L 33/36* (2013.01); *H01L 33/382* (2013.01); *H01L 33/387* (2013.01); *H01L 33/44* (2013.01); *H01L 33/62* (2013.01); *H01L 2924/12041* (2013.01); *H01L 2933/0066* (2013.01)

(56) References Cited

U.S. PATENT DOCUMENTS

2012/0032218 A1* 2/2012 Choi .................. H01L 33/08
 257/98
2016/0093769 A1 3/2016 Vom Dorp et al.
2018/0219133 A1 8/2018 Park et al.
2018/0351046 A1* 12/2018 Baur .................. H01L 33/405

* cited by examiner

SEMICONDUCTOR DEVICE

CROSS-REFERENCE TO RELATED APPLICATION

This application claims priority to and the benefit of Korean Patent Application No. 2017-0181407, filed on Dec. 27, 2017 and Korean Patent Application No. 2018-0056203, filed on May 16, 2018, the disclosure of which is incorporated herein by reference in its entirety.

BACKGROUND

1. Field of the Invention

Exemplary embodiments relate to a semiconductor device.

2. Discussion of Related Art

A semiconductor device including a compound such as GaN and AlGaN may be variously used as a light-emitting device, a light-receiving device, and various diodes due to many advantages thereof, such as wide and easily adjustable bandgap energy.

In particular, light-emitting devices, such as light-emitting diodes and laser diodes, which use a III-V group or II-VI group compound semiconductor material, are capable of rendering various colors, such as red, green, blue, and ultraviolet, by virtue of the development of thin-film growth technologies and device materials, are capable of producing white light at high efficiency using fluorescent materials or through color mixing, and have advantages such as low power consumption, semi-permanent lifespan, fast response speed, safety, and environmental friendliness as compared to conventional light sources, such as fluorescent lamps and incandescent lamps.

In addition, when a light-receiving device such as a photodetector or a solar cell is manufactured using a III-V group or II-VI group compound semiconductor material, due to the development of an element material, the light-receiving device generates a photocurrent by absorbing light in various wavelength regions so that light in various wavelength regions from a gamma ray region to a radio wavelength region can be used. In addition, since the light-receiving device has advantages of having fast response speed, safety, environmental friendliness, and easy control of an element material, the light-receiving device can also be easily used for power control, a microwave circuit, or a communication module Accordingly, application of the semiconductor device has expanded to being applied as a transmission module of an optical communication device, a light-emitting diode (LED) backlight capable of replacing a cold cathode fluorescent lamp (CCFL) which constitutes a backlight of a liquid crystal display (LCD) device; a white LED lighting device capable of replacing a fluorescent lamp or an incandescent lamp; a headlight for a vehicle; a traffic light; a sensor for sensing gas or fire; and the like. In addition, the application of the semiconductor device may be expanded to a high frequency application circuit, another power control device, and a communication module.

In particular, a light-emitting device configured to emit light in an ultraviolet (UV) wavelength region can be used for curing, medical, and germicidal applications due to a curing action and a bactericidal action.

Recently, research on a UV light-emitting device has been actively conducted. However, there are problems in that a vertical-type UV light-emitting device is difficult to implement and light output is decreased due to oxidation caused by exfoliation and moisture.

SUMMARY OF THE INVENTION

Exemplary embodiments provide a vertical-type semiconductor device and a flip-chip type semiconductor device.

In addition, provided is a semiconductor device having excellent light extraction efficiency.

Furthermore, provided is a semiconductor device having an excellent current spreading effect.

Problems to be solved in the exemplary embodiment are not limited thereto, and objects and effects that may be recognized from technical solutions or exemplary embodiments described hereinafter may also be included although not explicitly mentioned.

A semiconductor device according to an exemplary embodiment includes: a semiconductor structure including a first-conductive-type semiconductor layer, a second-conductive-type semiconductor layer, and an active layer disposed between the first-conductive-type semiconductor layer and the second-conductive-type semiconductor layer, wherein the semiconductor structure has a first recess passing through the second-conductive-type semiconductor layer and the active layer and disposed in a partial region of the first-conductive-type semiconductor layer, wherein the first recess is disposed along an outer surface of the semiconductor structure, and has a first bottom surface of the first-conductive-type semiconductor layer, a first side surface of the active layer disposed inward with respect to the first bottom surface of the first-conductive-type semiconductor layer, and a second side surface of the second-conductive-type semiconductor layer. The first bottom surface of the first-conductive-type semiconductor layer, the first side surface of the active layer, and the second side surface of the second-conductive-type semiconductor layer are exposed in the first recess.

The first recess may further have a third side surface disposed between the first bottom surface and the first side surface.

In another exemplary embodiment, the first recess may further have a fifth side surface of the active layer and a sixth side surface of the second-conductive-type semiconductor layer. The fifth side surface may be disposed to face the first side surface. The second side surface may be disposed to face the sixth side surface. Therefore, the first bottom surface of the first-conductive-type semiconductor layer may be disposed inward with respect to the fifth side surface and the sixth side surface.

A ratio of an area of an upper surface of the semiconductor structure to an area of the first recess may be in a range of 1:0.01 to 1:0.03.

A maximum separation distance between the first recess and the outer surface of the semiconductor structure may be in a range of 3 µm to 5 µm.

The semiconductor structure may have a first region and a second region separated by the first recess. The first region may be a region disposed between the outer surface of the semiconductor structure and the first bottom surface of the second-conductive-type semiconductor layer, which is exposed in the first recess. The second region may be a region disposed inside the first recess. Here, the first region may be a region between a region of the first bottom surface of the first-conductive-type semiconductor layer exposed in the first recess, and the outer surface of the semiconductor structure, a region between the first side surface of the active layer and the outer surface of the semiconductor structure, or a region between the second side surface of the second-conductive-type semiconductor layer and the outer surface of the semiconductor structure.

According to an exemplary embodiment, the semiconductor device may have a second recess disposed in the second region and passing through the second-conductive-type semiconductor layer and the active layer to expose a partial region of the first-conductive-type semiconductor layer.

When the semiconductor device has the second recess, a plurality of second recesses may be spaced apart from each other. However, the present invention is not limited thereto, and one second recess may be provided.

A ratio of an area of the first recess to an area of the second recess may be in a range of 1:6 to 1:10.

The semiconductor device may include first electrodes disposed in the second recesses and electrically connected to the first-conductive-type semiconductor layer, a plurality of second electrodes electrically connected to the second-conductive-type semiconductor layer, and an insulating layer disposed in the first recess.

The insulating layer may include a plurality of layers, for example, a first insulating layer and a second insulating layer. The first insulating layer and/or the second insulating layer may be disposed on the first bottom surface of the first-conductive-type semiconductor layer, which is exposed in the first recess.

In addition, in the case of an exemplary embodiment including the second recess, the first insulating layer and/or the second insulating layer and the first electrode may be disposed in the second recess.

The first electrodes may overlap the second region in a second direction, the second electrodes may overlap the second region in the second direction, and the second direction may be a thickness direction of the semiconductor structure.

The first recess and the second recess may have the same minimum length in the second direction and may overlap each other in a first direction, and the second direction may be the thickness direction of the semiconductor structure.

An inclination angle of the first recess may be the same as an inclination angle of the second recess, but the present invention is not limited thereto.

A manufacturing method of a semiconductor device according to an exemplary embodiment includes: growing a semiconductor structure and disposing a first recess and a second recess in the semiconductor structure, wherein the semiconductor structure includes a first-conductive-type semiconductor layer, a second-conductive-type semiconductor layer, and an active layer disposed between the first-conductive-type semiconductor layer and the second-conductive-type semiconductor layer; wherein the first recess passes through the second-conductive-type semiconductor layer and the active layer, is disposed in a partial region of the first-conductive-type semiconductor layer, and is disposed along an outer surface of the semiconductor structure; and the second recess passes through the second-conductive-type semiconductor layer and the active layer and is disposed in a partial region of the first-conductive-type semiconductor layer, wherein the first recess is disposed adjacent to the side surface of the semiconductor structure with respect to the second recess.

The outer surface may be an outermost surface of the semiconductor structure. The semiconductor structure may further have an upper surface and a lower surface. The outer surface may be disposed between the upper surface and the lower surface. In addition, the semiconductor structure may further have a plurality of inner surfaces due to the first recess and the second recess. The plurality of inner surfaces may be spaced apart from each other. In addition, a height of the inner surface may be lower than a height of the outer surface with respect to the lower surface of the semiconductor structure.

The manufacturing method may further include disposing a first insulating layer, a first electrode, and a second electrode on the semiconductor structure and disposing a second insulating layer on the first insulating layer, wherein the first insulating layer is disposed on the first recess.

The second conductive layer may be electrically connected to the second electrode.

The manufacturing method may further include disposing a second insulating layer on the second conductive layer and disposing a bonding layer and a substrate on the second insulating layer.

A semiconductor device according to an exemplary embodiment includes: a substrate having a plurality of side surfaces extending in different directions, a semiconductor structure disposed on the substrate and including a first-conductive-type semiconductor layer, a second-conductive-type semiconductor layer, and an active layer disposed between the first-conductive-type semiconductor layer and the second-conductive-type semiconductor layer, an electrode pad disposed on the substrate and spaced apart from the semiconductor structure, and a second conductive layer disposed between the semiconductor structure and the electrode pad, and the substrate, wherein the electrode pad is disposed in a pad region in which the plurality of side surfaces are in contact with each other and has an outer surface adjacent to the side surfaces and an inner surface adjacent to the semiconductor structure; and the semiconductor structure has a first recess passing through the second-conductive-type semiconductor layer and the active layer and disposed in a partial region of the first-conductive-type semiconductor layer, a first edge surface extending along the side surface of the substrate, and a second edge surface extending along the inner surface of the electrode pad; wherein the first recess extends along the first edge surface and the second edge surface; and the second conductive layer has a first conductive region disposed inside the first recess and a second conductive region extending from the first conductive region to the electrode pad.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which.

DETAILED DESCRIPTION OF EXEMPLARY EMBODIMENTS

Figure 1:
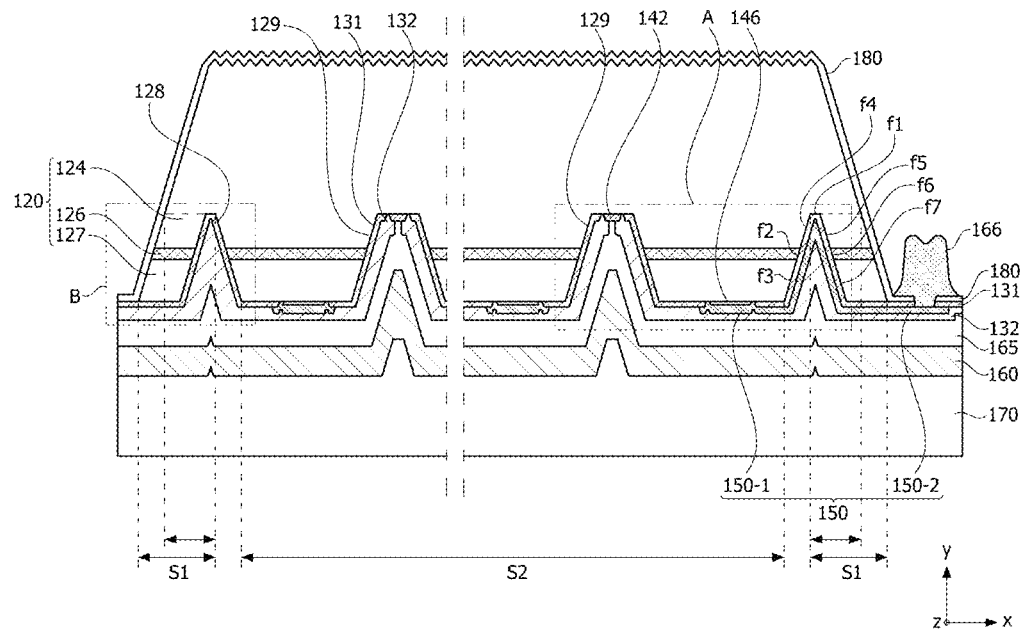
FIG. 1 is a conceptual view illustrating a semiconductor device according to a first exemplary embodiment.

While the present invention is open to various modifications and alternative embodiments, specific embodiments thereof will be described and shown by way of example in the drawings. However, it should be understood that there is no intention to limit the present invention to the particular embodiments disclosed, and, on the contrary, the present invention is to cover all modifications, equivalents, and alternatives falling within the spirit and scope of the present invention.

It should be understood that, although the terms including ordinal numbers such as "first," "second," and the like may be used herein to describe various elements, the elements are not limited by the terms. The terms are only used to distinguish one element from another. For example, a second element could be termed a first element without departing from the scope of the present invention, and similarly a first element could be also termed a second element. The term "and/or" includes any and all combinations of a plurality of associated listed items.

In the case one component is mentioned as "connected to" or "accessing" another component, it may be connected to or access the corresponding component directly. However, other component(s) may exist in between. On the other hand, in the case that one component is mentioned as "directly connected to" or "directly accessing" another component, it should be understood that other component(s) may not exist in between.

The terminology used herein is for the purpose of describing particular embodiments only and is not intended to limit the present invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, components, and/or groups thereof but do not preclude the presence or addition of one or more other features, integers, steps, operations, elements, components, and/or groups thereof.

Unless defined otherwise, all the terms (including technical and scientific terms) used herein have the same meaning as commonly understood by one of ordinary skill in the art to which the present invention belongs. It will be further understood that the terms, such as those defined in commonly used dictionaries, should be interpreted as having meanings that are consistent with their meanings in the context of the relevant art, and should not be interpreted in an idealized or overly formal sense unless expressly defined otherwise herein.

Hereinafter, example embodiments will be described in detail with reference to the attached drawings, and the same or corresponding elements will be given the same reference numbers regardless of drawing symbols, and redundant descriptions will be omitted.

A semiconductor structure 120 according to an exemplary embodiment of the present invention may output light in an ultraviolet wavelength range. In an example, the semiconductor structure 120 may output light in a near-ultraviolet wavelength range (UV-A), may output light in a far-ultraviolet wavelength range (UV-B), and may output light in a deep-ultraviolet wavelength range (UV-C). A wavelength range may be determined by a composition ratio of Al in the semiconductor structure 120. In addition, the semiconductor structure 120 may output light beams having various wavelengths, which have different intensities. A peak wavelength of a light beam having the strongest intensity compared to intensity of light beams having other wavelengths among the output light beams may be fall in the range of near-ultraviolet light, far-ultraviolet light, or deep-ultraviolet light.

In an example, the UV-A may have a wavelength of 320 nm to 420 nm, the UV-B may have a wavelength of 280 nm to 320 nm, and the UV-C may have a wavelength of 100 nm to 280 nm.

Figure 2:
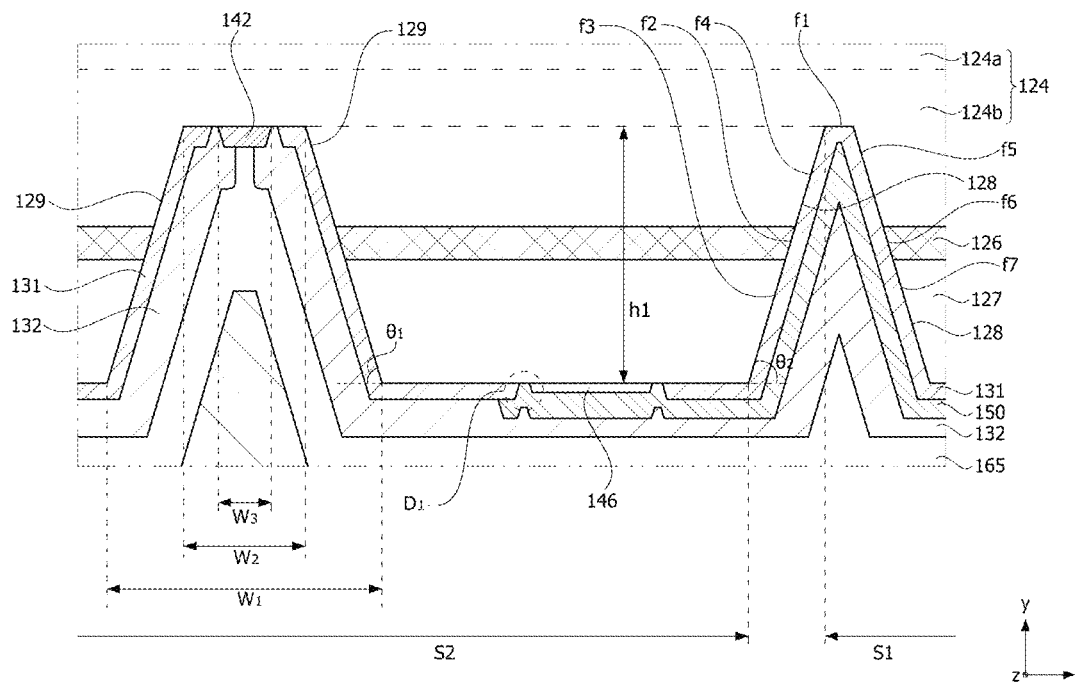
FIG. 2 is an enlarged view of portion A in FIG. 1.
Figure 3:
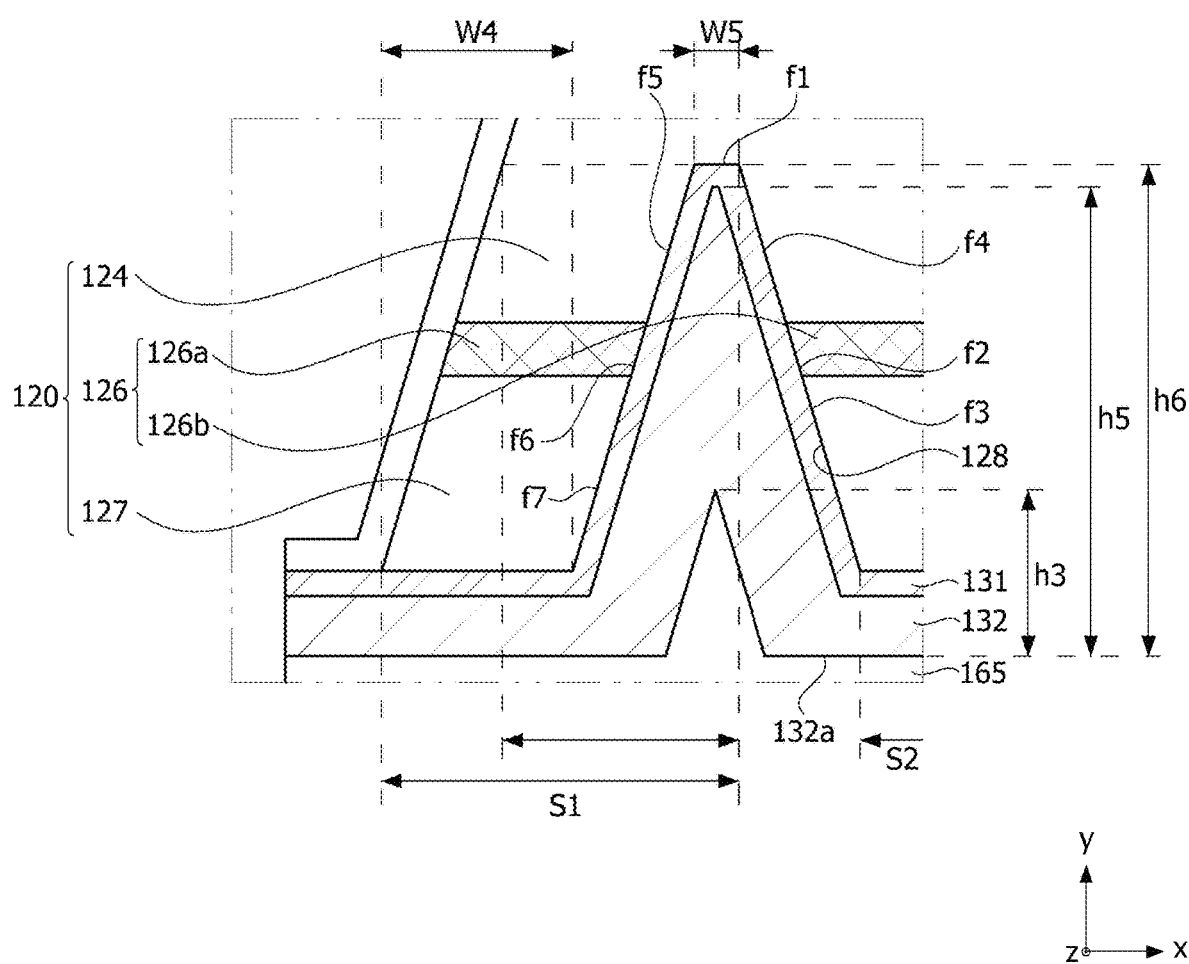
FIG. 3 is an enlarged view of portion B in FIG. 1.
Figure 4:
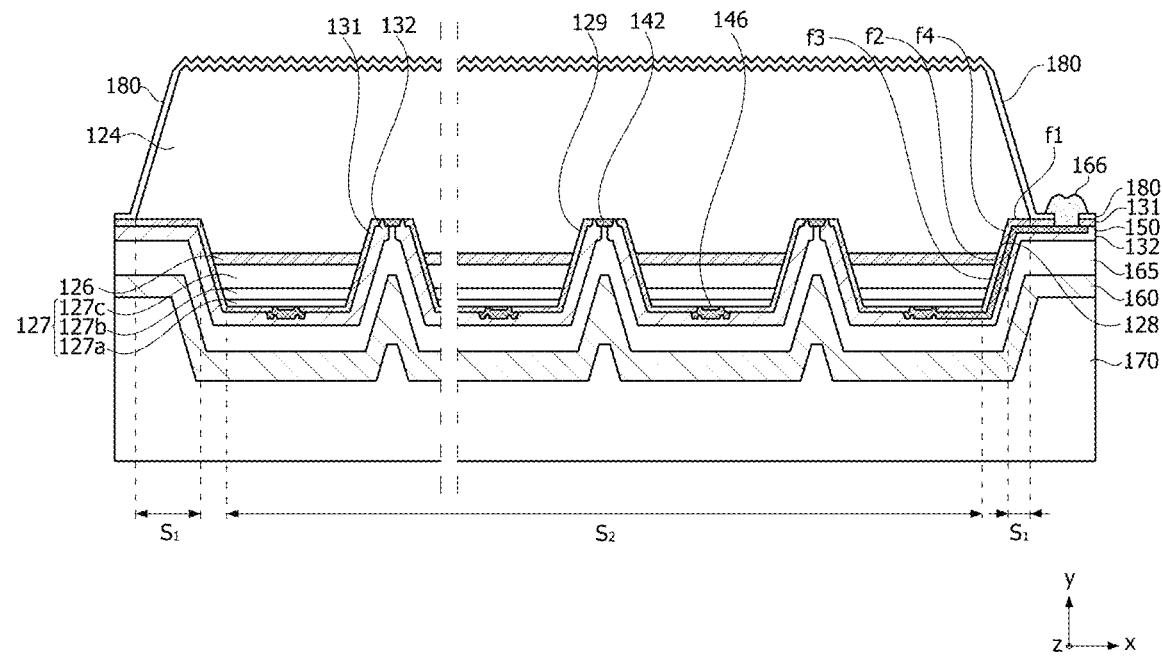
FIG. 4 is a conceptual view illustrating a semiconductor device according to a second exemplary embodiment.

FIG. 1 is a conceptual view illustrating a semiconductor device 10 according to a first exemplary embodiment, FIG. 2 is an enlarged view of portion A in FIG. 1, and FIG. 3 is an enlarged view of portion B in FIG. 1. FIG. 4 is a conceptual view illustrating a semiconductor device according to a second exemplary embodiment.

Referring to FIG. 1, the semiconductor device 10 according to the first exemplary embodiment may include the semiconductor structure 120 including a first-conductive-type semiconductor layer 124, a second-conductive-type semiconductor layer 127, an active layer 126, a first electrode 142 electrically connected to the first-conductive-type semiconductor layer 124, and a second electrode 146 electrically connected to the second-conductive-type semiconducting layer 127.

The first-conductive-type semiconductor layer 124, the active layer 126, and the second-conductive-type semiconductor layer 127 may be disposed in a second direction (y direction). In the following description, a thickness direction of each layer, i.e., the second direction (y direction) is defined as a vertical direction, and a first direction (x direction) perpendicular to the second direction (y direction) is defined as a horizontal direction. A third direction (z direction) is a direction perpendicular to both the first direction and the second direction.

The first-conductive-type semiconductor layer 124 may be implemented using a III-V group or II-IV group compound semiconductor or the like and may be doped with a first dopant. The first-conductive-type semiconductor layer 124 may be made of at least one material selected from semiconductor materials having an empirical formula of $In_{x1}Al_{y1}Ga_{1-x1-y1}N$ ($0 \leq x1 \leq 1$, $0 \leq y1 \leq 1$, and $0 \leq x1+y1 \leq 1$), such as GaN, AlGaN, InGaN, and InAlGaN. The first dopant may be an n-type dopant such as Si, Ge, Sn, Se, or Te. When the first dopant is the n-type dopant, the first-conductive-type semiconductor layer 124 doped with the first dopant may be an n-type semiconductor layer.

The active layer 126 may be disposed between the first-conductive-type semiconductor layer 124 and the second-conductive-type semiconductor layer 127. The active layer 126 may be a layer in which electrons (or holes) injected through the first-conductive-type semiconductor layer 124 are recombined with holes (or electrons) injected through the second-conductive-type semiconductor layer 127. As electrons and holes are recombined, the electrons transition to a low energy level, and the active layer 126 may generate light having a wavelength corresponding to bandgap energy of a well layer to be described later, which is included in the active layer 126. Among wavelengths of light emitted by the semiconductor device 10, a wavelength of light having the strongest intensity may be in ultraviolet light. The ultraviolet light may be fall in the rage of the above-described near-ultraviolet light, the far-ultraviolet light, or the deep-ultraviolet light.

The active layer 126 may have any one of a single well structure, a multi well structure, a single quantum well structure, a multi-quantum well (MQW) structure, a quantum dot structure, and a quantum line structure, but a structure of the active layer 126 is not limited thereto.

The second-conductive-type semiconductor layer 127 may be formed on the active layer 126, may be implemented using a III-V group or II-IV group compound semiconductor or the like, and may be doped with a second dopant. The second-conductive-type semiconductor layer 127 may be made of a semiconductor material having an empirical formula of $In_{x5}Al_{y2}Ga_{1-x5-y2}N$ ($0 \leq x5 \leq 1$, $0 \leq y2 \leq 1$, and $0 \leq x5+y2 \leq 1$), or may be made of a material selected from AlInN, AlGaAs, GaP, GaAs, GaAsP, and AlGaInP. When the second dopant is a p-type dopant such as Mg, Zn, Ca, Sr, or Ba, the second-conductive-type semiconductor layer 127 doped with the second dopant may be a p-type semiconductor layer.

Additionally, an electron blocking layer (not shown) may be disposed between the active layer 126 and the second-conductive-type semiconductor layer 127. The electron blocking layer (not shown) may block electrons, which are supplied to the active layer 126 from the first-conductive-type semiconductor layer 124, from flowing into the second-conductive-type semiconductor layer 127 without being recombined with holes in the active layer 126, thereby increasing the probability of the recombination between the electrons and the holes in the active layer 126. An energy bandgap of the electron blocking layer (not shown) may be greater than an energy bandgap of the active layer 126 and/or the second-conductive-type semiconductor layer 127.

The electron blocking layer (not shown) may include at least one selected from semiconductor materials having an empirical formula of $In_{x1}Al_{y1}Ga_{1-x1-y1}N$ ($0 \leq x1 \leq 1$, $0 \leq y1 \leq 1$, and $0 \leq x1+y1 \leq 1$), for example, AlGaN, InGaN, and InAlGaN, but the present invention is not limited thereto. In the electron blocking layer (not shown), a first layer (not shown) having a high aluminum composition and a second layer (not shown) having a low aluminum composition may be alternately arranged.

Each of the first-conductive-type semiconductor layer 124, the active layer 126, and the second-conductive-type semiconductor layer 127 may include aluminum. Therefore, the first-conductive-type semiconductor layer 124, the active layer 126, and the second-conductive-type semiconductor layer 127 may include AlGaN. However, the present invention is not necessarily limited thereto.

For example, the electron blocking layer (not shown) may include an aluminum composition of 50% or 90%. When the aluminum composition of the electron blocking layer (not shown) is less than 50%, a height of an energy barrier for blocking electrons may be insufficient, and the electron blocking layer (not shown) may absorb light emitted from the active layer 126. When the aluminum composition exceeds 90%, electrical characteristics of the semiconductor device may be degraded.

First, the semiconductor structure 120 may have a first recess 128. The first recess 128 may pass through the second-conductive-type semiconductor layer 127 and the active layer 126 and may be disposed in a partial region of the first-conductive-type semiconductor layer 124. In other word, The first recess 128 may pass through the second-conductive-type semiconductor layer 127, the active layer 126 and a first portion of the first-conductive-type semiconductor layer.

The first recess 128 may have a first bottom surface f1 of the first-conductive-type semiconductor layer 124, a first side surface f2 of the active layer 126, which is disposed inward with respect to the first bottom surface f1 of the first-conductive-type semiconductor layer 124, and a second side surface f3 of the second-conductive-type semiconductor layer 127.

In addition, the first recess 128 may have a third side surface f4 of the first-conductive-type semiconductor layer 124, which is exposed between the second side surface f3 and the first bottom surface f1. When a process margin for removing only the second-conductive-type semiconductor layer 127 and the active layer 126 is possible, the first recess 128 may have the first side surface f2 of the second-conductive-type semiconductor layer 127, the second side surface f3 of the active layer 126, and the first bottom surface f1 of the first-conductive-type semiconductor layer 124. That is, the bottom surface f1 of the first-conductive-type semiconductor layer 124 may be the same as an upper surface of the active layer 126.

However, when the process margin is taken into consideration in the first recess 128, the first recess 128 may further have the third side surface f4 of the first-conductive-type semiconductor layer 124 in addition to the exposed first bottom surface f1 of the first-conductive-type semiconductor layer 124. Here, the third side surface f4 may be an exposed outer surface of the first-conductive-type semiconductor layer 124, may be disposed inside the semiconductor structure 120 with respect to the first bottom surface f1, and may be disposed between the first bottom surface f1 and the first side surface f2. In the drawings, the process margin is taken into account, but the present invention also includes a case in which the process margin is possible as described above.

The first bottom surface f1 may be a surface disposed on a top of the first recess 128. The first bottom surface f1 may be located inward from an outer surface of the semiconductor structure 120 and may be the same as a top surface which extends from and is connected to the upper surface of the active layer 126 in the vertical direction (y axis direction).

The third side surface f4 may extend inside the semiconductor structure 120 from the first bottom surface f1 and may be an exposed surface of the first-conductive-type semiconductor layer 124. Thus, the third side surface f4 may be disposed inside the semiconductor structure 120 with respect to the first bottom surface f1.

The first side surface f2 may extend inside the semiconductor structure 120 from the first bottom surface f1 and the third side surface f4 and may be an exposed surface of the active layer 126. Thus, the first side surface f2 may be disposed inside the semiconductor structure 120 with respect to the first bottom surface f1 and the third side surface f4.

The second side surface f3 may be an exposed surface of the second-conductive-type semiconductor layer 127, which extends inside the semiconductor structure 120 from the first bottom surface f1, the third side surface f4, and the first side surface f2. Thus, the second side surface f3 may be disposed inside the semiconductor structure 120 with respect to the first bottom surface f1, the third side surface f4, and the first side surface f2. In particular, in the semiconductor device 10, the first side surface f2 of the active layer 126 may be spaced apart from the outer surface of the semiconductor structure 120 and thus may be easily prevented from being oxidized from external moisture or contaminants.

The first side surface f2, the second side surface f3, and the third side surface f4 may be spaced apart from the outer surface of the semiconductor structure 120.

In addition, in the first exemplary embodiment, the semiconductor structure 120 may further have a fourth side surface f5, a fifth side surface f6, and a sixth surface f7, which are disposed between the first bottom surface f1 and the outer surface of the semiconductor structure 120. The fourth side surface f5 and the third side surface f4 may be disposed to face each other. In the case of the above-described exemplary embodiment, the first recess 128 may have the first bottom surface f1, the first side surface f2, the second side surface f3, the third side surface f4, the fourth side surface f5, the fifth side surface f6, and the sixth side surface f7. The first bottom surface f1 may be disposed between the third side surface f4 and the fourth side surface f5, between the first side surface f2 and the fifth side surface f6, and/or between the second side surface f3 and the sixth side surface f7.

Specifically, the fourth side surface f5 is a side surface of the first-conductive-type semiconductor layer 124, which is disposed outside the first bottom surface f1. The fifth side surface f6 is a side surface of the active layer 126, which is disposed outside the fourth side surface f5. The sixth side surface f7 is a side surface of the second-conductive-type semiconductor layer 127, which is disposed outside the fifth side surface f6.

In addition, the fourth side surface f5, the fifth side surface f6, and the sixth side surface f7 may be disposed inward with respect to the outer surface of the semiconductor structure 120. That is, the fourth side surface f5, the fifth side surface f6, and the sixth side surface f7 may be disposed between the first bottom surface f1 (or the first recess 128) and an outermost surface of the semiconductor structure 120. In addition, the fourth side surface f5, the fifth side surface f6, and the sixth side surface f7 may be disposed symmetrically with the first to third side surfaces f2 to f4 with respect to the first bottom surface f1. However, the fourth side surface f5 may not have a symmetrical structure according to a manufacturing method or the like.

Referring to FIG. 4, as described above, the semiconductor device according to the second exemplary embodiment may include a semiconductor structure 120 including a first-conductive-type semiconductor layer 124, a second-conductive-type semiconductor layer 127, an active layer 126, a first electrode 142 electrically connected to the first-conductive-type semiconductor layer 124, and a second electrode 146 electrically connected to the second-conductive-type semiconducting layer 127.

In addition, the semiconductor structure 120 may include a first recess 128. The first recess 128 may be disposed along an outer surface of the semiconductor structure 120. As described above, the first recess 128 may have an exposed first bottom surface f1 of the first-conductive-type semiconductor layer 124, a first side surface f2 of the active layer 126, and a second side surface f3 of the second-conductive-type semiconductor layer 127. Similarly, in the semiconductor structure 120, the first side surface f2 may be disposed inside the first bottom surface f1, and the second side surface f3 may be disposed inside the first side surface f2.

Unlike FIG. 1, in the semiconductor device according to the second exemplary embodiment, the first bottom surface f1 may extend to be in contact with the outer surface of the semiconductor structure 120, and thus, the above-described fourth side surface may not exist. Accordingly, the active layer 126 and the second-conductive-type semiconductor layer 127 may not exist outside the first recess 128.

In addition, the first bottom surface f1 of the first recess 128 may be in contact with the outer surface of the semiconductor structure 120. In this case, like the first exemplary embodiment, the first side surface f2 of the active layer 126, which is exposed by the first recess 128, may be spaced apart from the outer surface of the semiconductor structure 120, thereby preventing oxidation of the active layer 126, which is caused by permeation of external moisture and/or other contaminants.

In addition, in the semiconductor device, a lower structure of the semiconductor structure 120 may be a cup structure due to the first recess 128, the lower structure of the semiconductor structure 120 including a first insulating layer 131, a second conductive layer 150, a first conductive layer 165, a second insulating layer 132, a bonding layer 160, and a substrate 170, which will be described later. However, the present invention is not limited thereto.

In addition, the second-conductive-type semiconductor layer 127 may include $(2\text{-}1)^{th}$, $(2\text{-}2)^{th}$, and $(2\text{-}3)^{th}$-conductive-type semiconductor layers 127a, 127b, and 127c. The $(2\text{-}1)^{th}$-conductive-type semiconductor layer 127a may have an aluminum composition less than that of the $(2\text{-}2)^{th}$-conductive-type semiconductor layer 127b and the $(2\text{-}3)^{th}$-conductive-type semiconductor layer 127c. This may be applied equally to the semiconductor device according to the first exemplary embodiment described above.

In addition, as described later, in the semiconductor device, the semiconductor structure 120 may further have a second recess 129, and the second recess 129 may pass through the second-conductive-type semiconductor layer 127 and the active layer 126 and may be disposed in a partial region of the first-conductive-type semiconductor layer 124. In other word, the second recess 129 may pass through the second-conductive-type semiconductor layer 127, the active layer 126 and a second portion of the first-conductive-type semiconductor layer.

An inclination angle of the first recess 128 may be greater than 90° and less than 145°. The inclination angle may be an angle formed by the first insulating layer 131 and a horizontal plane (x-z plane). When the angle is less than 90° or greater than 145°, an effect, in which light travelling toward a side surface is reflected upward by the first insulating layer 131, may be lowered.

Referring again to FIGS. 1 to 3, in an exemplary embodiment, when the semiconductor device 10 includes a substrate and the semiconductor structure 120 is disposed on the substrate, the first electrode 142 may be disposed on the semiconductor structure 120, and the second electrode 146 may be disposed between the semiconductor structure 120 and the substrate. In addition, such a structure may be applied to a vertical-type structure or a flip-type structure such as in FIG. 5B to be described later.

In addition, the present invention is not limited thereto, and in order to smooth injection characteristics of a current injected into the semiconductor device, the semiconductor structure 120 may further have the second recess 129 which passes through the second-conductive-type semiconductor layer 127 and the active layer 126 and is disposed in a partial region of the first-conductive-type semiconductor layer 124. Specifically, since the first recess 128 is disposed further outside than the semiconductor structure 120 with respect to the second recess 129, a current injected through the first electrode 142 disposed inside the second recess 129 in the semiconductor structure 120 may be spread in an inner region (a second region S2 to be described later) so that light extraction efficiency of the semiconductor device can be improved.

When the semiconductor structure 120 further has the second recess 129, the first electrode 142 may be electrically connected to the first-conductive-type semiconductor layer 124 exposed in the second recess 129. However, the semiconductor structure 120 according to the exemplary embodiment may include only the first recess 128 or may include both the first recess 128 and the second recess 129.

Since the first recess 128 is disposed along the outer surface of the semiconductor structure 120 and passes through the partial region of the first conductive-type semiconductor layer 124, in the semiconductor structure 120, each of the second-conductive-type semiconductor layer 127 and the active layer 126 may be separated by the first recess 128. That is, the first recess 128 may form a closed loop on a plane (x-z plane). However, as described later, since a plurality of first recesses 128 are disposed along an edge of the semiconductor structure 120, the semiconductor structure 120 may be separated into a first region S1 and a second region S2 by a closed loop formed by the first recesses 128 or an imaginary line formed by extending and connecting the first recesses 128 along the edge of the semiconductor structure 120. For example, the second region S2 may be located inside the closed loop, and the first region S1 may be located outside the closed loop (hereinafter, descriptions will be provided based on the closed loop, but the contents of the first region and the second region may be equally applied even when the imaginary line formed by extending and connecting the first recesses 128 along the edge of the semiconductor structure 120 forms a closed loop.

Specifically, the semiconductor structure 120 may be separated into the first region S1 and the second region S2 by the first recess 128. The first region S1 may be an outer region of the semiconductor structure 120 from the first bottom surface f1 of the first recess 128 in the semiconductor structure 120, and the second region S2 may be a region inside the first region S1. The first region S1 may be a non-emission region in which electrons and holes are not coupled. The second region S2 may be a region disposed inside the first recesses 128 and thus may be an emission region. In this case, the first region S1 may be a region which extends outward from the first bottom surface f1 and is in contact with the outer surface of the semiconductor structure 120. This will be described below. As shown, the first region S1 is not limited thereto and may be a region from the first bottom surface f1 to the outermost surface of the semiconductor structure 120. In addition, a passivation layer 180 surrounding side surfaces and an upper surface of the semiconductor structure 120 may be exfoliated from the semiconductor structure 120 or be cracked due to heat generated by operation of a light-emitting device, external high temperature or high humidity, a thermal expansion coefficient difference from the semiconductor structure 120, or the like. When such exfoliation or a crack is generated, the semiconductor structure 120 may be oxidized due to external moisture or contaminants permeating the semiconductor structure 120 from the outside. For example, when ultraviolet light is generated, an Al concentration may be increased so as to increase an energy bandgap of the active layer 126. Thus, the active layer 126 may be vulnerable to oxidation by Al. In this regard, the first recess 128 according to the exemplary embodiment may block a direct connection between the active layer 126 of the first region S1 and the active layer 126 of the second region S2. Accordingly, as shown in FIG. 1, when the active layer 126 exists on sidewalls of the semiconductor structure 120 and is exposed to the outside due to exfoliation, the active layer 126 may be oxidized. In this regard, a distance between the active layer 126 of the first region S1 and the active layer 126 of the second region S2 in the semiconductor structure 120 may be increased due to the separation by the first recess 128. Thus, in the semiconductor device 10 according to the first exemplary embodiment, even when the active layer 126 of the first region S1 is oxidized, the active layer 126 of the second region S2 may be protected from the oxidation.

In addition, the first insulating layer 131 is disposed on the first recess 128. The first insulating layer 131 may prevent the active layer 126 of the second region S2 from being continuously oxidized due to the oxidation of the active layer 126 which is in contact with the sidewalls of the semiconductor structure 120.

As will be described with reference to FIG. 7A, when the semiconductor structure 120 generates ultraviolet light, since the semiconductor structure 120 has high bandgap energy, current spreading characteristics of the semiconductor structure 120 may be lowered, and an effective emission region may be small. For example, when the semiconductor structure 120 includes a GaN-based compound semiconductor, the semiconductor structure be made of $Al_xGa(1-x)N$ (0≤x≤1) containing a large amount of Al to emit ultraviolet light. Here, as the x value indicating Al content is increased, resistance of the semiconductor structure 120 may be increased, and thus, current spreading and current injection characteristics of the semiconductor structure 120 may be lowered. For example, a current may be spread in the second region S2. Thus, even when the semiconductor device 10 has the first recess 128, the semiconductor device 10 may maintain light output. Furthermore, a region in the active layer 126, which is oxidized by moisture or the like, may be limited to a region outside the first recess 128 (i.e., the first region S1) by the first recess 128 so that the first recess 128 may maintain light output by protecting the active layer 126 disposed in an effective emission region (i.e., the active layer 126 of the second region S2) from oxidation.

In addition, a ratio of an area of an upper surface of the semiconductor structure 120 to an area of a lower surface of the first recess 128 may be in a range of 1:0.01 to 1:0.03.

When the ratio of the area of the upper surface of the semiconductor structure 120 to the area of the lower surface of the first recess 128 is less than 1:0.01, it is difficult to prevent oxidation of the active layer 126, which is caused by contaminants. When the ratio of the area of the upper surface of the semiconductor structure 120 to the area of the lower surface of the first recess 128 is greater than 1:0.03, light efficiency is lowered.

In addition, a maximum separation distance W4 (see FIG. 3) between the first recess 128 and the outer surface of the semiconductor structure 120 may be in a range of 3 μm to 5 μm. This may be modified according to a size of a semiconductor device or a semiconductor structure.

In addition, the upper surface of the first recess 128 may have a minimum horizontal width W5 (see FIG. 3) of 3 μm to 5 μm. In addition, when the semiconductor device has the second recess 129, a minimum width W2 of an upper surface of the second recess 129, to be described below, may be a width of the second recess 129 disposed on a bottom surface of the second-conductive-type semiconductor layer 127. A width may be a length in the horizontal direction (x direction).

Furthermore, the second recess 129 may be disposed in the second region S2, that is, may overlap the second region S2 in the vertical direction (y direction). Therefore, the second recess 129 may be disposed inside the semiconductor structure 120 with respect to the first recess 128.

The first electrode 142 may be disposed in the second recess 129 and may be electrically connected to the first-conductive-type semiconductor layer 124.

The first electrode 142 may be disposed on a low concentration layer 124b of the active layer 126 in order to secure relatively smooth current injection characteristics. That is, it is preferable that the second recess 129 be formed to occupy a region of the low concentration layer 124b of the active layer 126. This is because a high concentration layer 124a of the active layer 126 has a high Al concentration and thus has relatively low current diffusion characteristics.

In addition, the first electrode 142 may overlap the second region S2 in the vertical direction (y direction). A current may be injected through the first electrode 142 in the second region S2, and the semiconductor structure 120 may generate light.

The second electrode 146 may be disposed on a lower portion of the first-conductive-type semiconductor layer 127 and may be electrically connected to the first-conductive-type semiconductor layer 127.

The first electrode 142 and the second electrode 146 may be an ohmic electrode. The first electrode 142 and the second electrode 146 may include at least one selected from indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO nitride (IZON), Al—Ga ZnO (AGZO), In—Ga ZnO (IGZO), ZnO, $IrO_x$, $RuO_x$, NiO, $RuO_x$/ITO, Ni/$TrO_x$/Au, Ni/$TrO_x$/Au/ITO, Ag, Ni, Cr, Ti, Al, Rh, Pd, Ti, Sn, In, Ru, Mg, Zn, Pt, Au, and Hf, but the present invention is not limited to these materials. In an example, the first electrode 142 may include a plurality of metal layers (for example, Cr/Al/Ni), and the second electrode 146 may include ITO.

The first insulating layer 131 may be disposed on a lower portion of the semiconductor structure 120 and may electrically insulate the first electrode 142 from the active layer 126 and the second conductive-type semiconductor layer 127. In addition, the first insulating layer 131 may electrically insulate the second electrode 146 and the second conductive layer 150 from the first conductive layer 165. Furthermore, the first insulating layer 131 may prevent a side surface of the active layer 126 from being oxidized during a process of the semiconductor device 10.

In addition, the first insulating layer 131 may be formed on the lower portion of the semiconductor structure 120 excluding positions at which the first electrode 142 and the second electrode 146 are disposed. That is, the first insulating layer 131 may be disposed in the first recess 128. As a result, the first insulating layer 131 may increase a distance at which the active layer 126 of the first region S1 and the active layer 126 of the second region S2 are connected to each other through the first-conductive-type semiconductor layer 124.

The first insulating layer 131 may be made of at least one selected from the group consisting of $SiO_2$, $Si_xO_y$, $Si_3N_4$, $Si_xN_y$, $SiO_xN_y$, $Al_2O_3$, $TiO_2$, and AlN, but the present invention is not limited thereto. The first insulating layer 131 may be formed as a single-layer or a multi-layer. In an example, the first insulating layer 131 may be a distributed Bragg reflector (DBR) having a multi-layer structure, including Si oxide or a Ti compound. However, the present invention is not necessarily limited thereto, and the first insulating layer 131 may have various reflective structures.

In addition, when the first insulating layer 131 performs a reflection function, the first insulating layer 131 may improve light extraction efficiency by upwardly reflecting light emitted to a side surface from the active layer 126. In this case, as the number of the second recesses 129 is increased, light extraction efficiency may be further improved.

In addition, a width W3 of the first electrode 142 may be in a range of 24 μm to 50 um. When the range is satisfied, it is advantageous to spread current, and a large number of the first electrodes 142 may be disposed. When the width W3 of the first electrode 142 is 24 μm or more, it is possible to sufficiently secure a current injected into the first-conductive-type semiconductor layer 124. When the width W3 of the first electrode 142 is 50 μm or less, it is possible to sufficiently secure a plurality of first electrodes 142 in the first-conductive-type semiconductor layer 124, thereby securing current spreading characteristics. Here, the width W3 of the first electrode 142 may be a diameter when the first electrode 142 has a circular shape and may be a maximum width when the first electrode 142 has an elliptic or polygonal structure. As described above, a width may be a length in the horizontal direction (x direction).

In addition, light output of the semiconductor structure 120 may be controlled through a change in the number of the second recesses 129. This will be described later in detail with reference to FIGS. 7A and 7B.

A minimum length h1 of the second recess 129 in the vertical direction (y direction) may be equal to a minimum length h1 of the first recess 128 in the vertical direction (y direction). Therefore, the second recess 129 may overlap the first recess 128 in the horizontal direction (x direction). An inclination angle θ1 of the second recess 129 may be the same as an inclination angle θ2 of the first recess 128.

Due to such a configuration, the first recess 128 and the second recess 129 may be simultaneously formed in the same process. Thus, the semiconductor device 10 according to the first exemplary embodiment may be implemented through a simplified process. However, the present invention is not limited to such a process.

The inclination angle θ1 of the second recess 129 and the inclination angle θ2 of the first recess 128 may be an angle formed by the first insulating layer 131 and the horizontal plane (x-z plane).

A minimum width W2 of the second recess 129 may be a minimum width of the second recess 129 in contact with the first-conductive-type semiconductor layer 124.

A maximum width W1 of the second recess 129 may be in a range of 38 μm to 60 μm. In this range, a plurality of first electrodes 142 may be disposed to be favorable for current spreading. The maximum width W1 of the second recess 129 may be defined as the widest area of the second recess, which is placed at a lower portion of the second-conductive-type semiconductor layer 127. The width W1 of the second recess 129 may be a diameter when the second recess 129 has a circular shape and may be a maximum width when the second recess 129 has an elliptic or polygonal structure.

The width W1 of the second recess 129 may be a width of the second recess 129 with respect to a lower surface of the second conductive-type semiconductor layer 127.

When the width W1 of the second recess 129 is 38 μm or more and the first electrode 142 is disposed in the second recess 129, it is possible to secure a process margin for securing an area for electrically connecting the first electrode 142 and the conductive-type semiconductor layer 124. When the width is 60 μm or less, it is possible to prevent a volume of the active layer 126, which is reduced so as to dispose the first electrode 142, from increasing, resulting in a decrease in luminous efficiency.

The inclination angle θ1 of the second recess 129 may be in a range of 70° to 90°. When such an area range is satisfied, it may be advantageous to form the first electrode 142 on an upper surface, and when such an area range is satisfied, it is possible to form a large number of second recesses 129.

When the inclination angle θ1 is less than 70°, an area of the active layer 126 may be increased, but an area in which the first electrode 142 is to be disposed may be decreased. Thus, current injection characteristics may be lowered, and luminous efficiency may be lowered. Therefore, a ratio of an area of the first electrode 142 to an area of the second electrode 146 may be adjusted by using the inclination angle θ1 of the second recess 129.

The second electrode 146 may be thinner than the first insulating layer 131. Therefore, it is possible to secure step coverage characteristics of the second conductive layer 150 and the second insulating layer 132 which surround the second electrode 146. In addition, it is possible to improve reliability of the semiconductor device 10. A first separation distance D1 between the second electrode 146 and the first insulating layer 131 may be in a range of 1 μm to 4 μm. When the first separation distance D1 is 1 μm or more, it is possible to secure a process margin of a process of disposing the second electrode 146 between the first insulating layers 131, thereby improving electrical characteristics, optical characteristics, and reliability of the semiconductor device 10. When the first separation distance D1 is 4 μm or less, it is possible to secure an entire area in which the second electrode 146 is disposed and to improve operating voltage characteristics of the semiconductor device 10.

The second conductive layer 150 may cover the second electrode 146. Accordingly, a second electrode pad 166, the second conductive layer 150, and the second electrode 146 may form one electrical channel.

The second conductive layer 150 may surround the second electrode 146 and may be disposed in contact with a lower surface of the first insulating layer 131. The second conductive layer 150 may be made of a material having a high adhesion force with respect to the first insulating layer 131. The second conductive layer 150 may be made of one material selected from the group consisting of Cr, Ti, Ni, Au, and alloys thereof and may include a single-layer or a plurality of layers.

The second conductive layer 150 may be disposed on a lower portion of the first insulating layer 131. The second conductive layer 150 may be disposed between the first insulating layer 131 and the second insulating layer 132, which will be described later. Therefore, the second conductive layer 150 may be protected from permeation of external moisture or contaminants by the first insulating layer 131 and the second insulating layer 132. In addition, the second conductive layer 150 may be disposed in the semiconductor device 10 and may be surrounded by the first and second insulating layers 131 and 132 so as not to be exposed at an outermost surface of the semiconductor device 10.

Furthermore, the second conductive layer 150 may be disposed on the substrate 170 and may be disposed between the electrode pad 166 and the semiconductor structure 120, and the substrate 170. The second conductive layer 150 may be disposed between the first insulating layer 131 and the second electrode 146. The second conductive layer 150 may be in contact with side surfaces and an upper surface of the second electrode 146 and side surfaces and an upper surface of the first insulating layer 131 within the first separation distance D1. In addition, a region in which the second conductive layer 150 and the second-conductive-type semiconductor layer 127 are in contact with each other to form a Schottky junction may exist within the first separation distance D1. Current spreading may be facilitated due to the formation of the Schottky junction. However, the present invention is not limited to such a configuration, and the second conductive layer 150 may be freely disposed within a range in which resistance between the second conductive layer 150 and the second-conductive-type semiconductor layer 127 is greater than resistance between the second electrode 146 and the second conductive-type semiconductor layer 127. In addition, the second conductive layer 150 may not exist according to a structure of the semiconductor device 10, but the present invention is not limited thereto.

Furthermore, the second conductive layer 150 may have a first conductive region 150-1 and a second conductive region 150-2. First, the first conductive region 150-1 may be disposed inside the first recess 128, and the second conductive region 150-2 may extend from the first conductive region 150-1 to the electrode pad 166.

Furthermore, most of the second conductive layer 150 may be surrounded by the first recess 128. However, the second conductive layer 150 may extend from a portion, which is adjacent to the electrode pad 166, to the electrode pad 166 disposed outside the semiconductor structure 120. That is, the first conductive region 150-1 may be surrounded by the first recess 128, and the second conductive region 150-2 may extend from the first conductive region 150-1 to the electrode pad 166 disposed outside the semiconductor structure 120. The first conductive region 150-1 and the second conductive region 150-2 will be described in detail with reference to FIG. 7D.

A reflective layer (not shown) may be disposed on the second conductive layer 150. The reflective layer (not shown) may be disposed between the second electrode 146 and the second conductive layer 150, and specifically, may be disposed on a lower portion of the second electrode 146.

In addition, the reflective layer (not shown) may electrically connect the second electrode 146 and the second conductive layer 150. When the reflective layer (not shown) exists, the second electrode pad 166, the second conductive layer 150, the reflective layer (not shown), and the second electrode 146 may form one electrical channel.

In addition, the reflective layer (not shown) may be made of a material having high reflectivity and may include any one of Ag and Rh, but the present invention is not limited to the materials.

The second insulating layer 132 may electrically insulate the second electrode 146 and the second conductive layer 150 from the first conductive layer 165.

The first conductive layer 165 may pass through the second insulating layer 132 and may be electrically connected to the first electrode 142. The second insulating layer 132 and the first insulating layer 131 may be made of the same material or different materials.

According to an exemplary embodiment, since the second insulating layer 132 is disposed on the first insulating layer 131 in a region between the first electrode 142 and the second electrode 146, the first insulating layer 131 may prevent permeation of external moisture and/or other contaminants even when the second insulating layer 132 is defective. In an example, when the first insulating layer 131 and the second insulating layer 132 are formed as a single-layer, defects such as cracks may be easily propagated in a thickness direction. Therefore, external moisture or contaminants may permeate the semiconductor structure 120 through defects exposed to the outside.

However, according to an exemplary embodiment, since the separate second insulating layer 132 is disposed on the first insulating layer 131, defects formed in the first insulating layer 131 are hardly propagated to the second insulating layer 132. That is, an interface between the first insulating layer 131 and the second insulating layer 132 may function to shield the propagation of defects.

Referring to FIG. 1, as described above, the second conductive layer 150 may electrically connect the second electrode 146 and the second electrode pad 166.

The second electrode 146 may be disposed directly in the second-conductive-type semiconductor layer 127. When the second-conductive-type semiconductor layer 127 includes AlGaN, a hole injection may not be smooth due to low electrical conductivity. Therefore, it is necessary to appropriately adjust an Al composition of the second-conductive-type semiconductor layer 127. The second conductive layer 150 may be made of one material selected from Cr, Ti, Ni, Au, and alloys thereof and may include a single-layer or a plurality of layers.

Referring to FIG. 3, a maximum height h3 of the bonding layer 165 from a lowermost surface 132a in the first recess 128 may be in a range of 0.4 μm to 0.6 μm. Here, the lowermost surface 132a means a lowermost surface of the second insulating layer 132. This may be equally applied below.

In addition, a maximum height h5 of the second insulating layer 132 from the lowermost surface 132a may be in a range of 1.7 μm to 2.1 μm in the vertical direction (y direction) in the first recess 128. In addition, a maximum height h6 of the first insulating layer 131 from the lowermost surface 132a may be in a range of 2.4 μm to 2.6 μm in the vertical direction (y direction) in the first recess 128.

Referring again to FIG. 1, the first conductive layer 165 and the bonding layer 160 may be disposed along a lower surface of the semiconductor structure 120 and a shape of the second recess 129. The first conductive layer 165 may be made of a material having high reflectivity. In an example, the first conductive layer 165 may include a metal such as Ti or Ni.

In addition, the first conductive layer 165 may provide a function for an electrical connection to the first electrode 142. Furthermore, the first conductive layer 165 may be disposed without including a material, such as silver (Ag), having high reflectivity. In this case, a reflective metal layer (not shown) having high reflectivity may be disposed between the first electrode 142 disposed in the second recess 129 and the first conductive layer 165 and between the second-conductive-type semiconductor layer 127 and the first conductive layer 165. However, as described above, when the second recess 129 does not exist, the first conductive layer 165 may not exist on the lower portion of the semiconductor structure 120. Since the first conductive layer 165 may be disposed on an upper portion of the first-conductive-type semiconductor layer 124 according to a structure of the semiconductor device 10, the present invention is not limited to such a position.

The bonding layer 160 may include a conductive material. In an example, the bonding layer 160 may include a material selected from the group consisting of gold, tin, indium, aluminum, silicon, silver, nickel, copper, and alloys thereof.

The substrate 170 may be made of a conductive material. In an example, the substrate 170 may include a metal or a semiconductor material. The substrate 170 may include a metal having high electrical conductivity and/or thermal conductivity. In this case, heat generated during operation of the semiconductor device 10 may be rapidly released to the outside. In addition, when the substrate 170 is formed of a conductive material, the first electrode 142 may receive a current from the outside through the substrate 170.

The substrate 170 may include a material selected from the group consisting of silicon, molybdenum, silicon, tungsten, copper, aluminum, and alloys thereof.

The passivation layer 180 may be disposed on an upper surface and side surfaces of the semiconductor structure 120. The passivation layer 180 may have a thickness of 200 nm to 500 nm. When the thickness is 200 nm or more, a device may be protected from external moisture or foreign substances, thereby improving electrical and optical reliability of the device. When the thickness is 500 nm or less, it is possible to reduce stress applied to the semiconductor device 10, to prevent a decrease in electrical and optical reliability of semiconductor device 10, and to reduce costs of the semiconductor device 10, which is caused by an increase in a process time of the semiconductor device 10.

Uneven portions may be formed on an upper surface of the semiconductor structure 120. Such an uneven portion may improve extraction efficiency of light emitted from the semiconductor structure 120. The uneven portions may have different average heights based on an ultraviolet wavelength. In the case of UV-C, the uneven portions have a height of about 300 nm to 800 nm and when an average height of about 500 nm to about 600 nm is provided, light extraction efficiency may be improved.

Figure 5A:
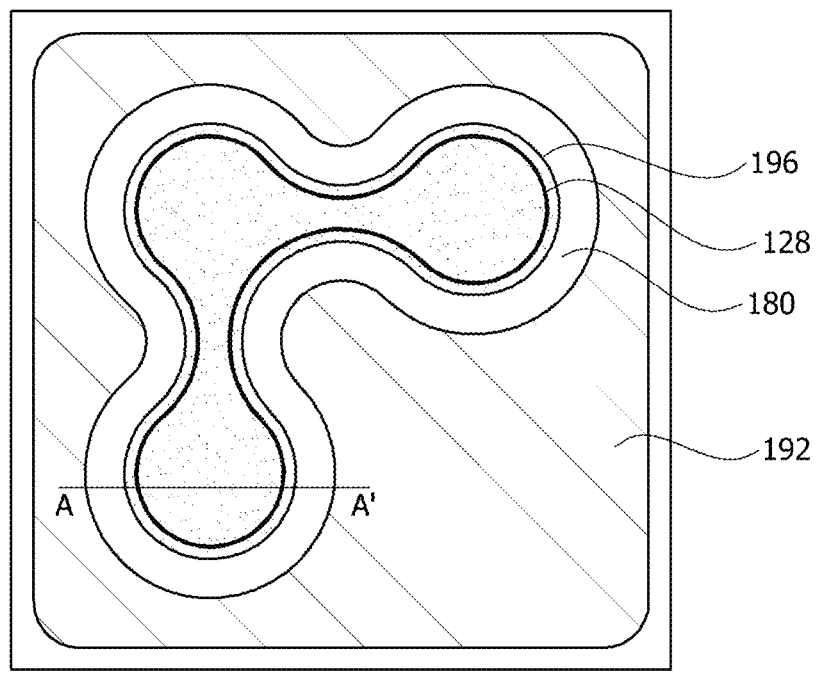
FIGS. 5A and 5B are a plan view and a cross-sectional view illustrating a semiconductor device according to a modified example.
Figure 5B:
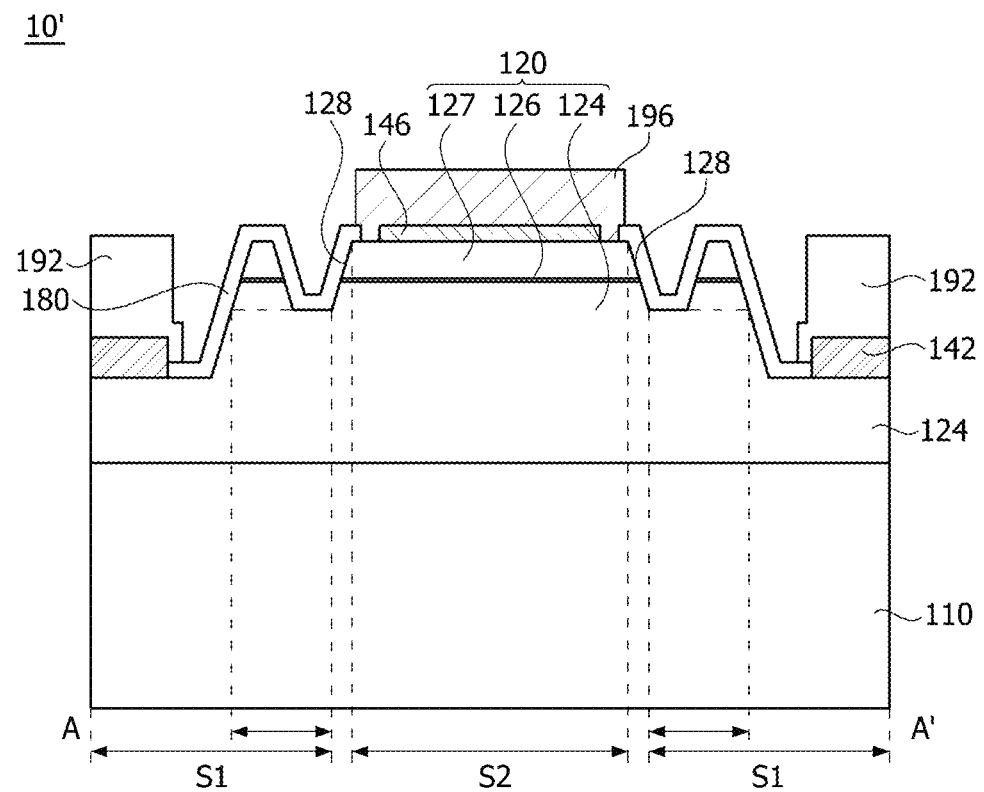
Figure 5C:
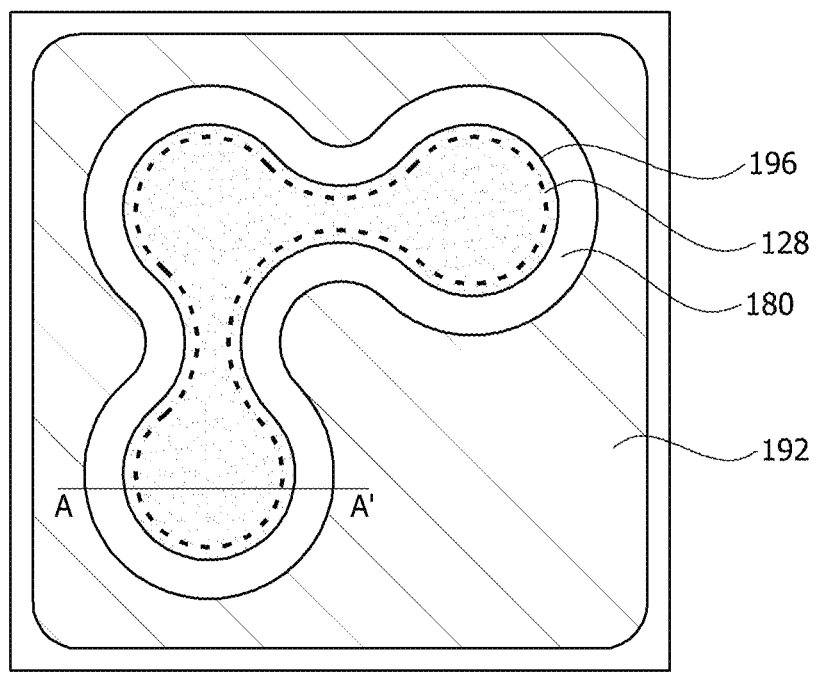
FIG. 5C illustrates another exemplary embodiment of FIG. 5A.

FIGS. 5A and 5B are a plan view and a cross-sectional view illustrating a semiconductor device 10' according to a modified example, and FIG. 5C illustrates another exemplary embodiment of FIG. 5A.

Referring to FIGS. 5A and 5B, the semiconductor device 10' according to the modified example may include a semiconductor structure 120 including a first-conductive-type semiconductor layer 124, a second-conductive-type semiconductor layer 127, an active layer 126, a first electrode 142 electrically connected to the first-conductive-type semiconductor layer 124, and a second electrode 146 electrically connected to the second-conductive-type semiconducting layer 127.

As described above, the semiconductor structure 120 may include the first-conductive-type semiconductor layer 124, the active layer 126, and the second-conductive-type semiconductor layer 127. The semiconductor structure 120 may have a first recess 128 which passes through the semiconductor layer 127 and the active layer 126 to expose a partial region of the first-conductive-type semiconductor layer 124. The contents of the first electrode 142, the second electrode 146, and the passivation layer 180 may be equally applied.

In addition, as described above, the first recess 128 may be disposed along an outer surface of the semiconductor structure 120 to separate the semiconductor structure 120 into a first region S1 and a second region S2. Similarly, the first recess 128 may form a closed loop on a plane. However, the present invention is not limited thereto.

The second region S2 may be located inside the closed loop, and the first region S1 may be located outside the closed loop. However, as described above, the semiconductor structure 120 may be separated into the first region S1 and the second region S2 by an imaginary line formed by extending the first recess 128 along an edge of the semiconductor structure 120. Hereinafter, descriptions will be provided based on a case in which the first recess 128 forms a closed loop. In addition, the first region S1 may be the same as described with reference to FIGS. 1 and 2.

When a passivation layer 180 is exfoliated, the active layer 126 of the first region S1 may be located outside the semiconductor structure 120 and thus may be oxidized from external moisture or contaminants. However, the oxidation generated in the active layer 126 of the first region S1 can be prevented from being propagated to the active layer 126 of the second region S2 by the first recess 128.

A first pad 192 may be disposed on the first electrode 142. In addition, a second pad 196 may be disposed on the second electrode 146. Thicknesses of the first pad 192 and the second pad 196 may be adjusted such that an upper surface of the first pad 192 and an upper surface of the second pad 196 are located at the same level from a lower surface of the semiconductor device 10'. For example, when the first electrode 142 and the second electrode 146 are bonded to each other by minimizing a height difference between an upper surface of the first electrode 142 and an upper surface of the second electrode 146, void generation may be reduced As described above, even in a flip-chip type semiconductor device, the oxidation of the active layer 126 of the first region S1, which is caused by external moisture or contaminants, may be easily prevented through the first recess 128. In addition, this may be equally applied to a vertical-type semiconductor device having only the first recess 128.

Referring to FIG. 5C, a plurality of first recesses 128 may be disposed along an outer surface of the semiconductor structure 120 so as to be spaced apart from each other. That is, the first recess 128 may not form a closed loop on a plane. However, as described above, although the active layer 126 of the first region is oxidized by external moisture or contaminations, a path, through which oxidation is propagated to the active layer 126 of the second region, may be extended by the first recess 128, thereby preventing the oxidation of the active layer 126 of the second region S2. As a result, the reliability of the semiconductor device 10' can be improved. In addition, the first region S1 and the second region S2 are respectively an outer region and an inner region of an imaginary line formed by extending and connecting the plurality of first recesses 128 spaced apart from each other in the semiconductor structure 120. The contents thereof may be the same as those described with reference to FIGS. 1 to 3 above.

Figure 6A:
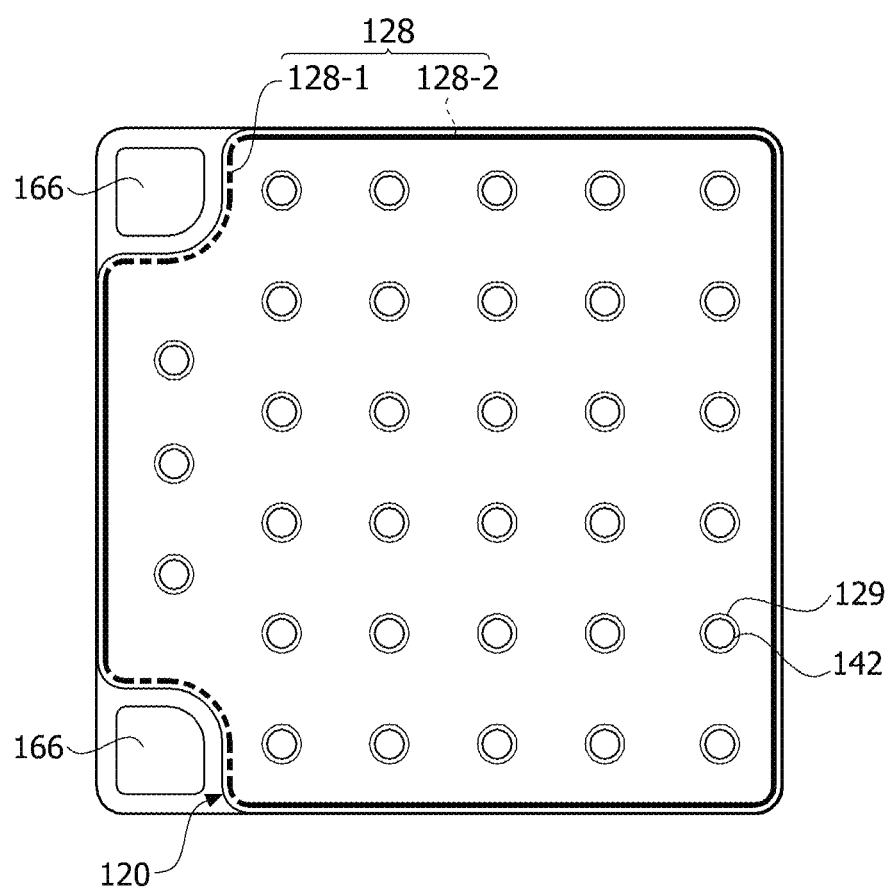
FIG. 6A is a plan view illustrating a semiconductor device according to a third exemplary embodiment.
Figure 6B:
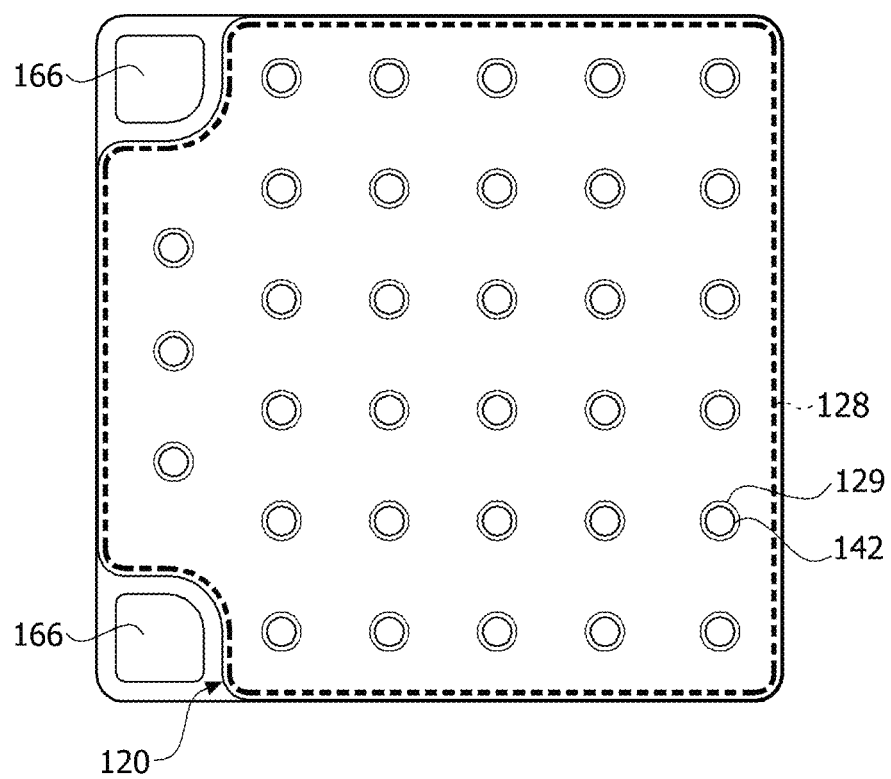
FIG. 6B is a plan view illustrating a semiconductor device according to a fourth exemplary embodiment.

FIG. 6A is a plan view illustrating a semiconductor device according to a third exemplary embodiment, and FIG. 6B is a plan view illustrating a semiconductor device according to a fourth exemplary embodiment.

Referring to FIG. 6A, a semiconductor structure 120 may include a first-conductive-type semiconductor layer, an active layer 126, and a second-conductive-type semiconductor layer, and may have a first recess 128 which passes through the second-conductive-type semiconductor layer and the active layer 126 to expose a partial region of the first-conductive-type semiconductor layer. The contents of a second recess 129, a first electrode 142, a second electrode, and a passivation layer may be equally applied.

The first recess 128 may be disposed along an outer surface of the semiconductor structure 120. Specifically, as will be described later with reference to FIG. 7D, the first recess 128 may have a $(1-1)^{th}$ recess 128-1 and $(1-2)^{th}$ recess 128-2.

The $(1-1)^{th}$ recess 128-1 may extend along an outer surface (second edge surface E2 in FIG. 7E) of the semiconductor structure 120, adjacent to an inner surface of an electrode pad 166. In addition, the $(1-2)^{th}$ recess 128-2 may extend along an adjacent outer surface (first edge surface E1 in FIG. 7E) of the semiconductor structure 120.

In this case, a plurality of $(1-1)^{th}$ recesses 128-1 may be spaced apart from each other, but the $(1-2)^{th}$ recess 128-2 may be continuously disposed.

That is, in the semiconductor device according to the third exemplary embodiment, the first recess 128 may not form a closed loop on a plane. However, when the active layer 126 of a first region is oxidized due to external moisture or contaminants, a path, through which oxidation is propagated to the active layer 126 of a second region, may be extended by the first recess 128, thereby improving reliability of the semiconductor device. Here, the first region and the second region are respectively an outer region and an inner region of an imaginary line formed by extending and connecting the $(1-1)^{th}$ recess 128-1 and the $(1-2)^{th}$ 128-2, and contents thereof may be the same as those described in FIGS. 1 to 3.

Referring to FIG. 6B, as described above, a semiconductor structure 120 may include a first-conductive-type semiconductor layer, an active layer, and a second-conductive-type semiconductor layer, and may have a first recess 128 which passes through the second-conductive-type semiconductor layer and the active layer to expose a partial region of the first-conductive-type semiconductor layer. The contents of a second recess 129, a first electrode 142, a second electrode, and a passivation layer may be equally applied.

The first recess 128 may be disposed along an outer surface of the semiconductor structure 120. In this case, a plurality of first recesses 128 may be spaced apart from each other along the semiconductor structure 120. That is, the plurality of first recesses 128 may be spaced apart from each other as in the $(1-1)^{th}$ recesses 128-1 described with reference to FIG. 6A. Due to such a configuration, in the semiconductor device according to the fourth exemplary embodiment, the first recesses 128 may not form a closed loop on a plane. However, as described above, although the active layer 126 of a first region is oxidized by external moisture or contaminations, a path, through which oxidation is propagated to the active layer 126 of a second region, may be extended by the first recess 128, thereby preventing the oxidation of the active layer 126 of the second region. As a result, the reliability of the semiconductor device can be improved. In addition, the first region and the second region are respectively an outer region and an inner region of an imaginary line formed by extending and connecting the plurality of first recesses 128 spaced apart from each other in the semiconductor structure 120, and contents thereof may be the same as those described in FIGS. 1 to 3.

Figure 7A:
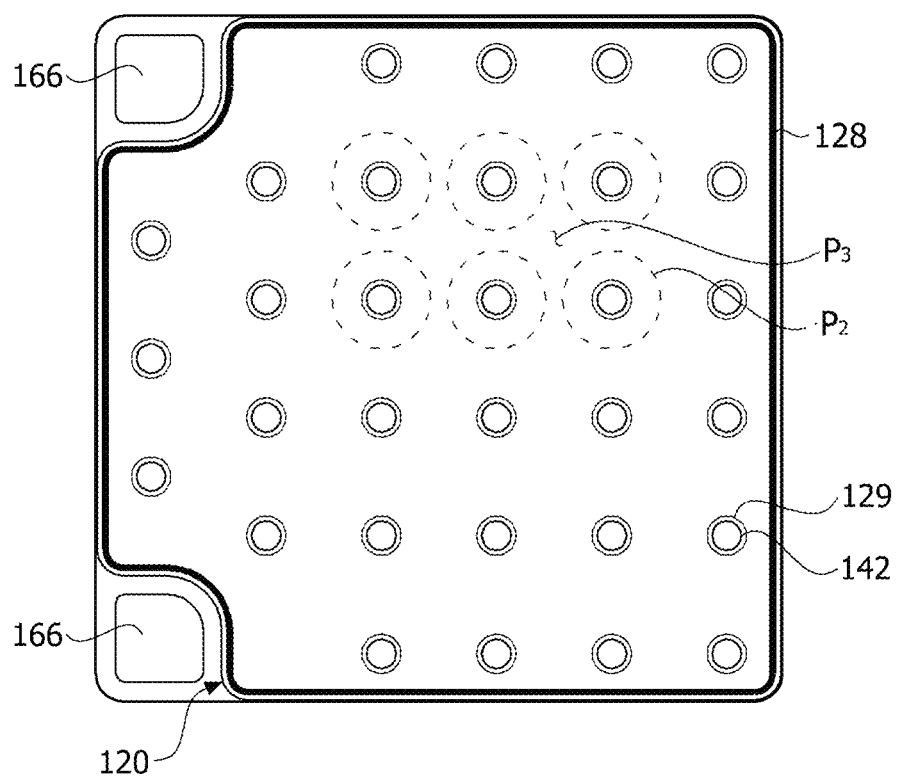
FIGS. 7A and 7B are views illustrating a configuration in which light output is improved according to a change in the number of second recesses.
Figure 7B:
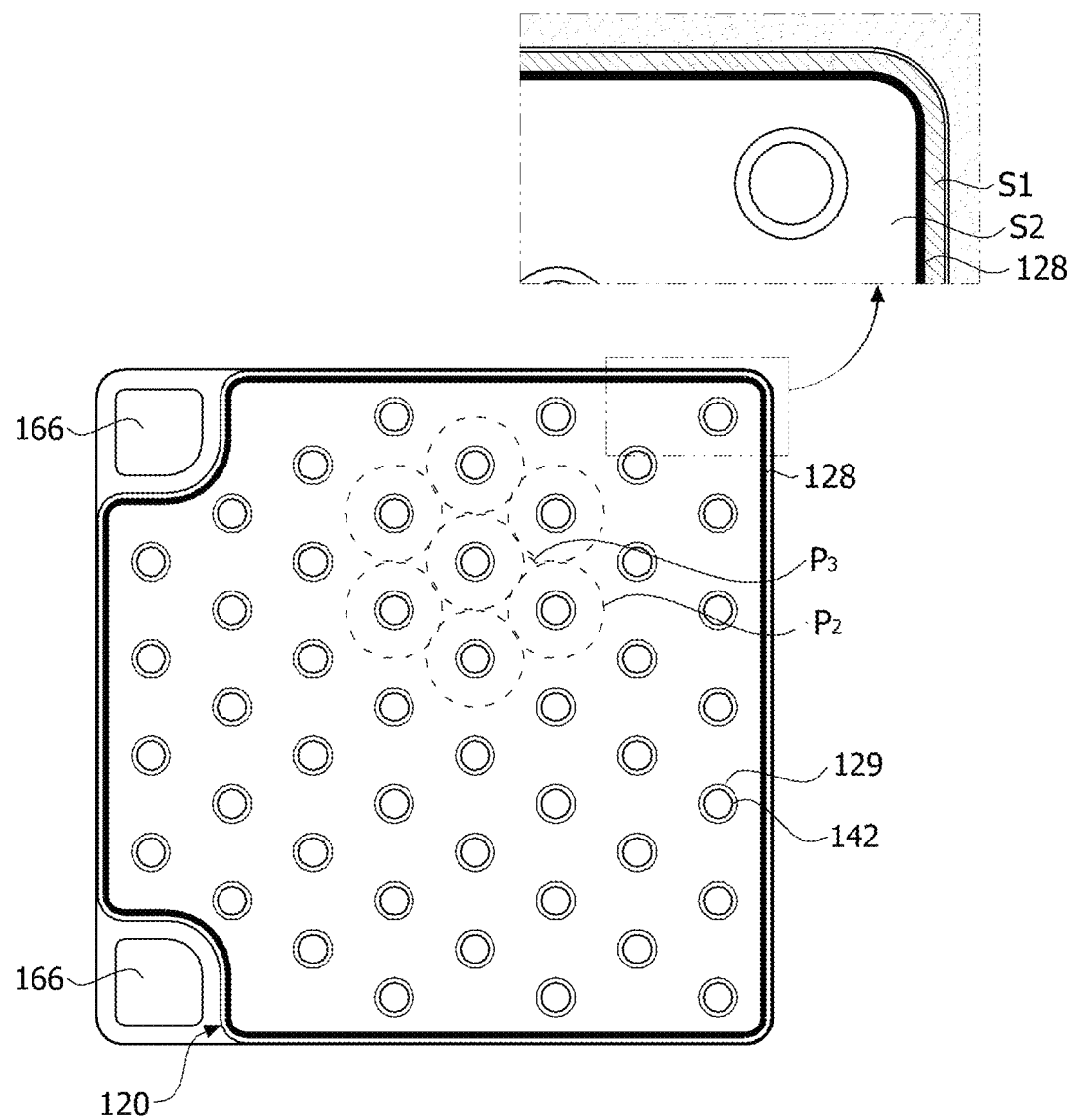
Figure 7C:
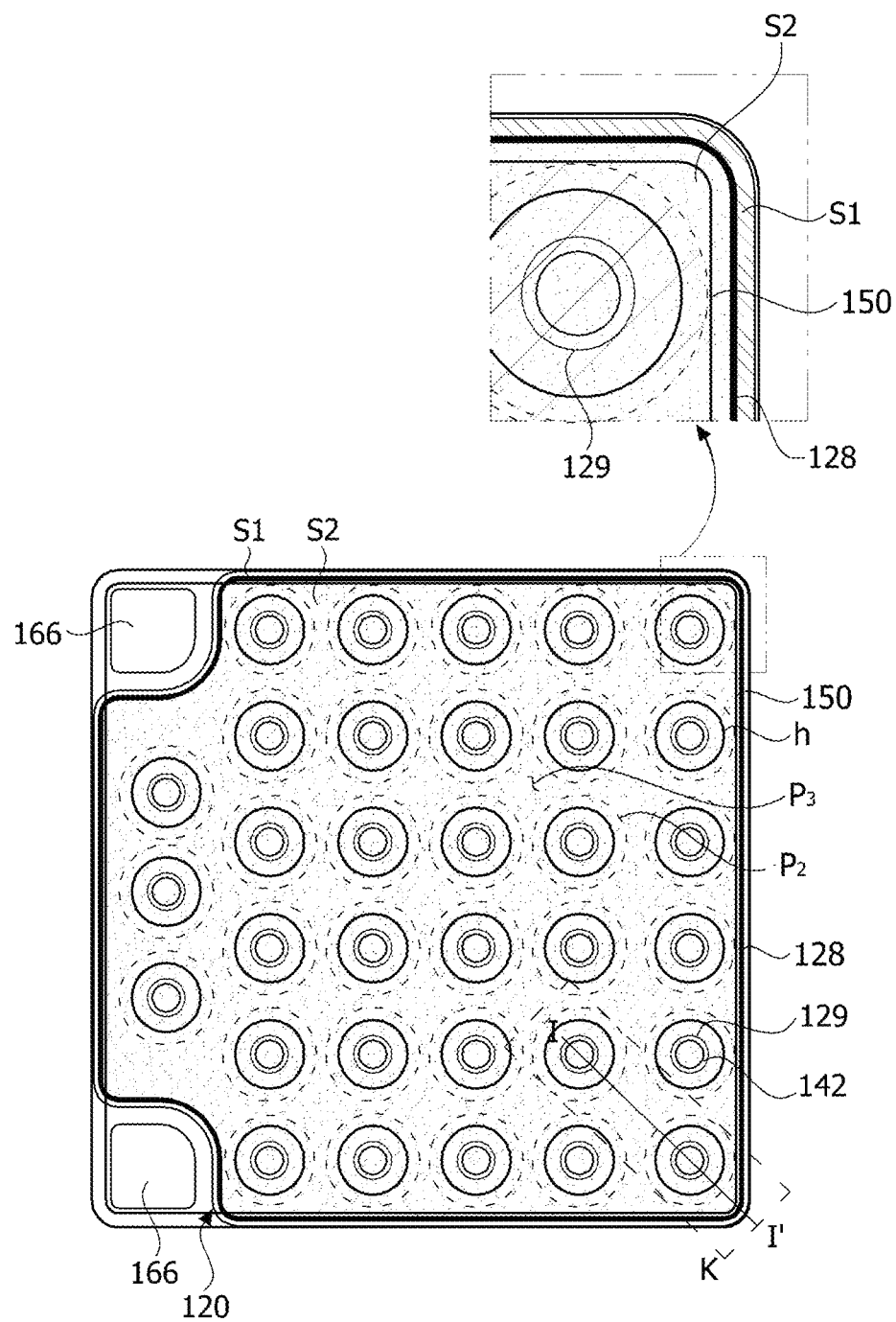
FIGS. 7C to 7E are plan views illustrating a semiconductor device.
Figure 7D:
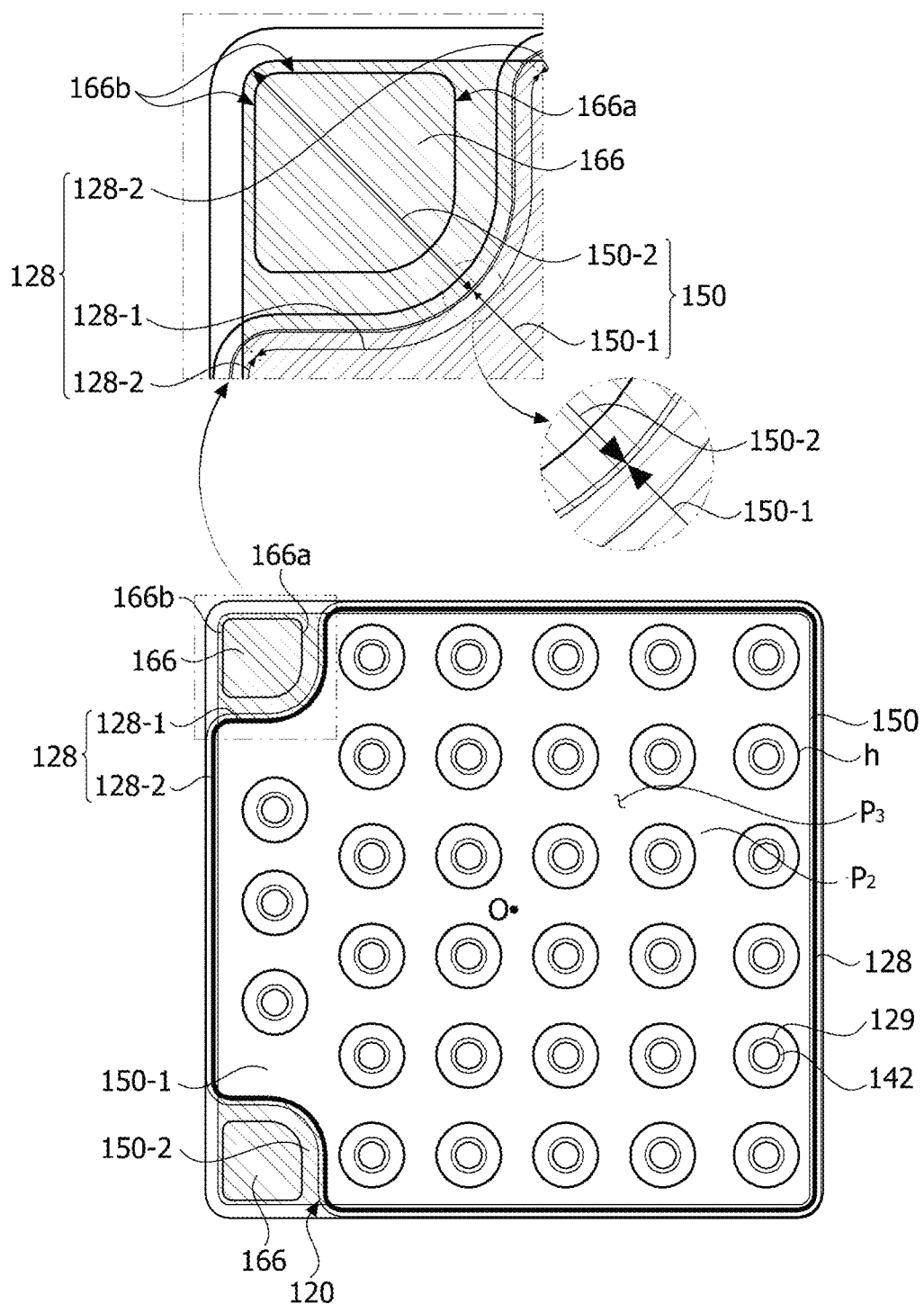
Figure 7E:
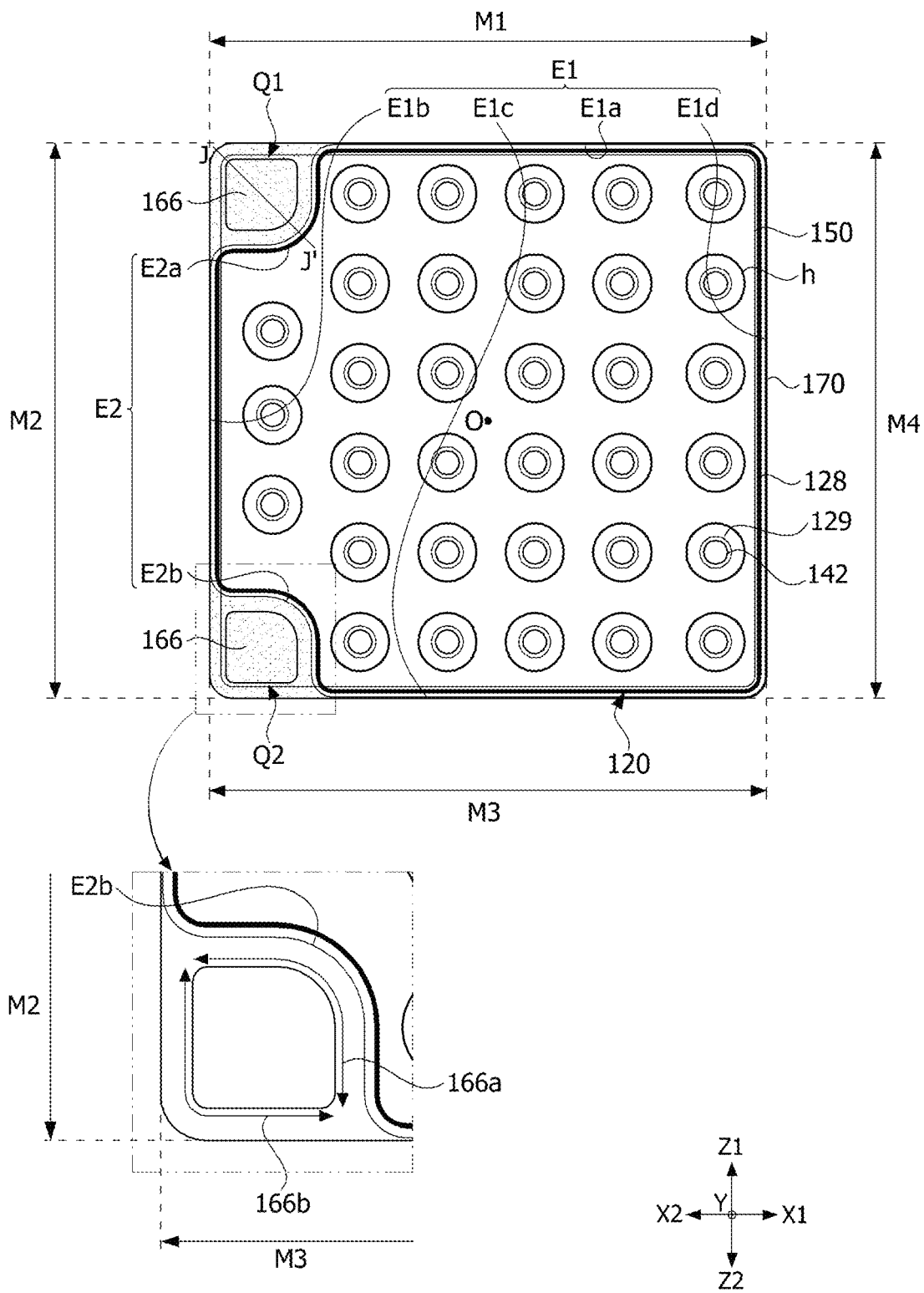

FIGS. 7A and 7B are views illustrating a configuration in which light output is improved according to a change in the number of second recesses, and FIGS. 7C to 7E are plan views illustrating a semiconductor device.

First, referring to FIG. 7A, when a GaN-based semiconductor structure 120 emits ultraviolet light, the GaN-based semiconductor structure 120 may include aluminum. When an aluminum composition of the semiconductor structure 120 is increased, current spreading characteristics may be lowered in the semiconductor structure 120. In addition, when an active layer 126 includes Al to emit ultraviolet light, in the active layer 126, an amount of light emitted to a side surface is increased as compared to a GaN-based blue light-emitting device (a transverse magnetic (TM) mode). The TM mode may mostly occur in an ultraviolet semiconductor device which generates ultraviolet light.

Current spreading characteristics of the ultraviolet semiconductor device are lowered compared to the GaN-based blue semiconductor device. Therefore, the ultraviolet semiconductor device requires relatively more first electrodes 142 compared to the GaN-based blue semiconductor device.

When an aluminum composition is increased, current spreading characteristics may be deteriorated. Referring to FIG. 7A, a current may be spread only at a place adjacent to each first electrode 142, and current density may be rapidly lowered at a place far away from each first electrode 142. Therefore, an effective emission region P2 may be narrowed.

The effective emission region P2 may be defined as a region from a center of the first electrode 142, which has the highest current density, to a boundary place having a current density which is 40% or less of the current density of the center of the first electrode 142. For example, the effective emission region may be adjusted according to a level of an injection current and an Al composition within a range of 40 μm from a center of a second recess 129.

A low current density region P3 may have low current density, and thus, an amount of light emitted therefrom may be smaller compared to the effective emission region P2. Therefore, light output can be improved by further disposing the first electrodes 142 in the low current density region P3 having the low current density, or by using a reflective structure.

Generally, since a GaN-based semiconductor device emitting blue light has relatively excellent current spreading characteristics, it is preferable to minimize an area of the second recess 129 and the first electrode 142. This is because an area of the active layer 126 is decreased as the area of the second recess 129 and the first electrode 142 is increased. However, in the case of the exemplary embodiment, since current spreading characteristics are relatively low due to a high aluminum composition, even though the area of the active layer 126 is sacrificed, it may be preferable that the area and/or number of the first electrodes 142 be increased to decrease the low current density region P3 or a reflective structure be disposed in the low current density region P3.

Referring to FIG. 7B, when the number of the second recesses 129 is increased to 48, the second recesses 129 may be disposed in a zigzag form rather than in a straight line in a transverse or a longitudinal direction. In this case, since the area of the low current density region P3 is decreased, most active layers 126 may participate in the light emission.

In addition, a first region S1 may be disposed to extend along the outer surface of the semiconductor structure 120 and may not overlap the effective emission region P2, and the second region S2 may overlap the effective emission region P2 so that light output may be maintained.

In the ultraviolet light-emitting device, current spreading characteristics may be lowered in the semiconductor structure 120, and a smooth current injection is required for securing uniform current density characteristics in the semiconductor structure 120 to secure electrical and optical characteristics and reliability of a semiconductor device. Accordingly, in order for the smooth current injection, a relatively large number of second recesses 129 may be formed compared to the general GaN-based semiconductor structure 120, and thus, the first electrode 142 may be provided.

Referring to FIG. 7C, a first recess 128 may be disposed in the semiconductor structure 120 and may not overlap the effective emission region P2. Specifically, since the effective emission regions P2 exist with respect to the plurality of first electrodes 142, a current may be spread in the effective emission region P2. For example, the plurality of first electrodes 142 may each form the effective emission region P2. In this case, the effective emission region P2 may overlap the above-described second region S2 and may not overlap the first region S1. That is, since the second region S2 separated by the first recess 128 is larger than the effective emission region P2, the first recess 128 may be disposed so as to not interrupt current spreading through the first electrode 142. Thus, even when the semiconductor device according to the exemplary embodiment has the first recess 128, light output may not be deceased.

Referring to FIGS. 7D and 7E, the semiconductor device may have various shapes. For example, the semiconductor device may have a quadrangular shape and may have a plurality of outer surfaces. The semiconductor device may have first to fourth outer surfaces M1 to M4. In this case, the outer surfaces of the semiconductor device may be the same as outermost surfaces of a substrate 170, a bonding layer, and a first conductive layer. Hereinafter, descriptions will be provided based on an outer surface of the substrate 170. The substrate 170 may have a plurality of outer surfaces, for example, first to fourth outer surfaces M1 to M4. The first outer surface M1 and the third outer surface M3 may be disposed to face each other, and the second outer surface M2 and the fourth outer surface M4 may be disposed to face each other. For example, the first outer surface M1 and the third outer surface M3 may be disposed at both side portions in a third direction (z direction), and the second outer surface M2 and the fourth outer surface M4 may be disposed both side portions in a first direction (x direction).

The first to fourth outer surfaces M1 to M4 may extend in different directions. The first outer surface M1 and the third outer surface M3 may extend in first directions (x1 and x2 directions), and the second outer surface M2 and the fourth outer surface M4 may extend in third directions (z1 and z2 directions). Specifically, the first outer surface M1 may extend a $(1-2)^{th}$ direction (x2 direction), and the second outer surface M2 may extend in a $(3-2)^{th}$ direction (z2 direction). The third outer surface M3 may extend a $(1-1)^{th}$ direction (x1 direction), and the fourth outer surface M4 may extend in a $(3-1)^{th}$ direction (z1 direction).

In addition, the substrate 170 may have curved surfaces on which the plurality of outer surfaces are in contact with each other, but the present invention is not limited thereto.

The semiconductor device may include the substrate 170, a semiconductor structure 120, and an electrode pad 166. The semiconductor structure 120 and the electrode pad 166 may be disposed on the substrate 170 and may be spaced apart from each other.

First, the substrate 170 may have a plurality of pad regions in which at least two of the first to fourth outer surfaces (M1 to M4) are in contact with each other, and the electrode pad 166 may be disposed in the pad region. Here, the substrate 170 may have a first pad region Q1 in which the first outer surface M1 and the second outer surface M2 are in contact with each other, and a second pad region Q2 in which the second outer surface M2 and the third outer surface M3 are in contact with each other The semiconductor device may include at least one electrode pad, and the number of the pad regions may be changed according to the number of the electrode pads. For example, when one electrode pad is provided, only the first pad region Q1 may exist, but the present invention is not limited thereto.

Hereinafter, in the substrate 170, the electrode pad 166 will be described as being disposed in the first pad region Q1 and the second pad region Q2. However, as described above, the electrode pad 166 may be disposed in a pad region in which the first outer side surface M1 and the fourth outer surface M4 are in contact with each other, or a pad region in which the fourth outer surface M4 and the third outer surface M3 are in contact with each other.

As a result, the electrode pad 166 may be disposed in both the first pad region Q1 and the second pad region Q2. Specifically, the electrode pad 166 may have an inner surface 166a and an outer surface 166b. The inner surface 166a of the electrode pad 166 is a side surface adjacent to the semiconductor structure 120 and is disposed toward an inside of the semiconductor device. The outer surface 166b of the electrode pad 166 is a side surface adjacent to the outer surface (for example, M1, M2, or M3) of the substrate 170.

As described above, the semiconductor structure 120 may be disposed on the substrate 170, the bonding layer, and the first conductive layer and may partially overlap the substrate 170, the bonding layer, and the first conductive layer in a vertical direction (y direction). Therefore, outer surfaces of the semiconductor structure 120 may be disposed inside the first to fourth outer surfaces M1 to M4 of the substrate 170. Here, the term "inside" may be a direction toward a center O of the semiconductor device, and the term "outer" may be a direction toward an edge of the semiconductor device. Here, the center O of the semiconductor device may be a center of the semiconductor device, for example, a center of a circle when the semiconductor device has a circular shape, and an intersection of diagonal lines connecting opposite corners of a quadrangle when the semiconductor device has a quadrangular shape (is symmetrical).

The semiconductor structure 120 may have a first edge surface E1 disposed along the first to fourth outer surfaces M1 to M4 of the substrate 170 adjacent thereto and a second edge surface E2 adjacent to the inner surface 166a of the electrode pad 166.

The first edge surface E1 may have a $(1-1)^{th}$ edge surface E1a, a $(1-2)^{th}$ edge surface E1b, a $(1-3)^{th}$ edge surface E1c, and a $(1-4)^{th}$ edge surface E1d. In addition, the second edge face E2 may have a $(2-1)^{th}$ edge surface E2a and a $(2-2)^{th}$ edge surface E2b and may be a curved surface. However, the present invention is not limited to the curved surface.

First, the $(1-4)^{th}$ edge surface E1d may be disposed outside in the $(1-1)^{th}$ direction (x1 direction). The $(1-1)^{th}$ edge surface E1a may be disposed at an outermost side in the $(3-1)^{th}$ direction (z1 direction) of the $(1-4)^{th}$ edge surface E1d, and may extend from one end of the $(1-4)^{th}$ edge surface E1d in the $(1-2)^{th}$ direction (x2 direction) along the first outer surface M1. The $(1-1)^{th}$ edge surface E1a may extend from the first outer surface M1 to a partial region in the first outer surface M1.

The $(2-1)^{th}$ edge surface E2a may extend from one end of the $(1-1)^{th}$ edge surface E1a in the $(3-2)^{th}$ direction (z2 direction) and then extend in the $(1-2)^{th}$ direction (x2 direction). That is, the $(2-1)^{th}$ edge surface E2a may extend inside the semiconductor device and then extend outside the semiconductor device. Thus, an extension direction of the $(2-1)^{th}$ edge surface E2a may be different from an extension direction of the nearest outer surface of the substrate 170. This may be equally applied to the $(2-2)^{th}$ edge surface E2b. In addition, the $(2-1)^{th}$ edge surface E2a may be a curved surface as described above, but the present invention is not limited thereto.

The $(1-2)^{th}$ edge surface E1b may be connected to the $(2-1)^{th}$ edge surface E2a, and may extend from one end of the $(2-1)^{th}$ edge surface E2a in the $(3-2)^{th}$ direction (z2 direction) along a $(2-2)^{th}$ outer surface M2b. The $(2-2)^{th}$ edge surface E2b may be connected to the $(1-2)^{th}$ edge surface E1b, extend from one end of the $(1-2)^{th}$ edge surface E1b to a partial region of the $(1-2)^{th}$ edge surface E1b in the $(1-1)^{th}$ direction (x1 direction), and then extend in the $(3-2)^{th}$ direction (z2 direction). In addition, the $(2-2)^{th}$ edge surface E2b may be a curved surface as described above, but the present invention is not limited thereto.

The $(1-3)^{th}$ edge surface E1c may extend from one end of the $(2-2)^{th}$ edge surface E2b in the $(1-1)^{th}$ direction (x1 direction). The $(1-4)^{th}$ edge surface E1d may extend from one end of the $(1-3)^{th}$ edge surface E1c in the $(3-1)^{th}$ direction (z1 direction) and may be connected to the $(1-1)^{th}$ edge surface E1a.

In addition, a partial region (for example, an end) of the first edge surface E1 may have a curved shape like the second edge surface E2, but the present invention is not limited thereto.

Only the $(2-1)^{th}$ edge surface E2a of the second edge surface E2 may exist in the semiconductor structure 120 according to the number of the electrode pads 166. In addition, a position of the pad region may be changed according to a position of the electrode pad 166. As described above, the edge surfaces of the semiconductor structure 120 may be changed according to the position, number, and shape of the electrode pads 166.

The first recess 128 may extend along the first edge surface E1 and the second edge surface E2. Specifically, the first recess 128 may have the $(1-1)^{th}$ recess 128-1 disposed along the second edge surface E2 and the $(1-2)^{th}$ recess 128-2 disposed along the first edge surface E1.

The $(1-2)^{th}$ recess 128-1 may extend along the first edge surface E1 of the semiconductor structure 120 adjacent thereto, and the $(1-1)^{th}$ recess 128-1 may extend along the second edge surface E2 of the semiconductor structure 120 adjacent thereto. Therefore, the $(1-1)^{th}$ recess 128-1 may extend in a direction different from an extension direction of the outer surface of the substrate 170 nearest thereto.

The second conductive layer 150 may be disposed on a lower portion of the $(1-1)^{th}$ recess 128-1. Alternatively, the second conductive layer 150 may not be disposed on a lower portion of the $(1-2)^{th}$ recess 128-2, and the $(1-2)^{th}$ recess 128-2 may not overlap the second conductive layer 150 (for example, a first conductive region 150-1 and a second conductive region 150-2 to be described below) in a thickness direction thereof. The $(1\text{-}2)^{th}$ recess 128-2 may be disposed between the first conductive region 150-1 and an edge of the semiconductor structure 120.

The second conductive layer 150 may have the first conductive region 150-1 and the second conductive region 150-2. The first conductive region 150-1 may be disposed inside the first recess 128, and the second conductive region 150-2 may extend from the first conductive region 150-1 outward, for example, to the electrode pad 166.

Specifically, the first conductive region 150-1 may be disposed inside the first and second edge surfaces E1 and E2 of the semiconductor structure 120 and the first to fourth outer surfaces M1 to M4 of the substrate 170. Alternatively, a portion of the second conductive region 150-2 may be disposed between the first and second edge surfaces E1 and E2 of the semiconductor structure 120 and an outer surface E of the semiconductor device. In addition, a portion of the second conductive region 150-2 may overlap the first recess 128 in the thickness direction of the first recess 128.

The second conductive region 150-2 may be disposed on the first pad region Q1 and the second pad region Q2. Therefore, the second conductive region 150-2 may be electrically connected to the electrode pad 166 of the pad region so that the second conductive layer 150 may form an electrical channel together with the electrode pad 166, the second conductive layer 150, and the second electrode.

When the semiconductor device has the second recess 129, the first conductive region 150-1 may have a plurality of holes h so as not to be electrically connected to the first electrode 142 in the second recess 129. The plurality of holes h may have a maximum width greater than that of the second recess 129, but the present invention is not limited to such a structure. In addition, the plurality of holes h may have various shapes such as a circular shape and a polygonal shape, but the present invention is not limited thereto.

Figure 7F:
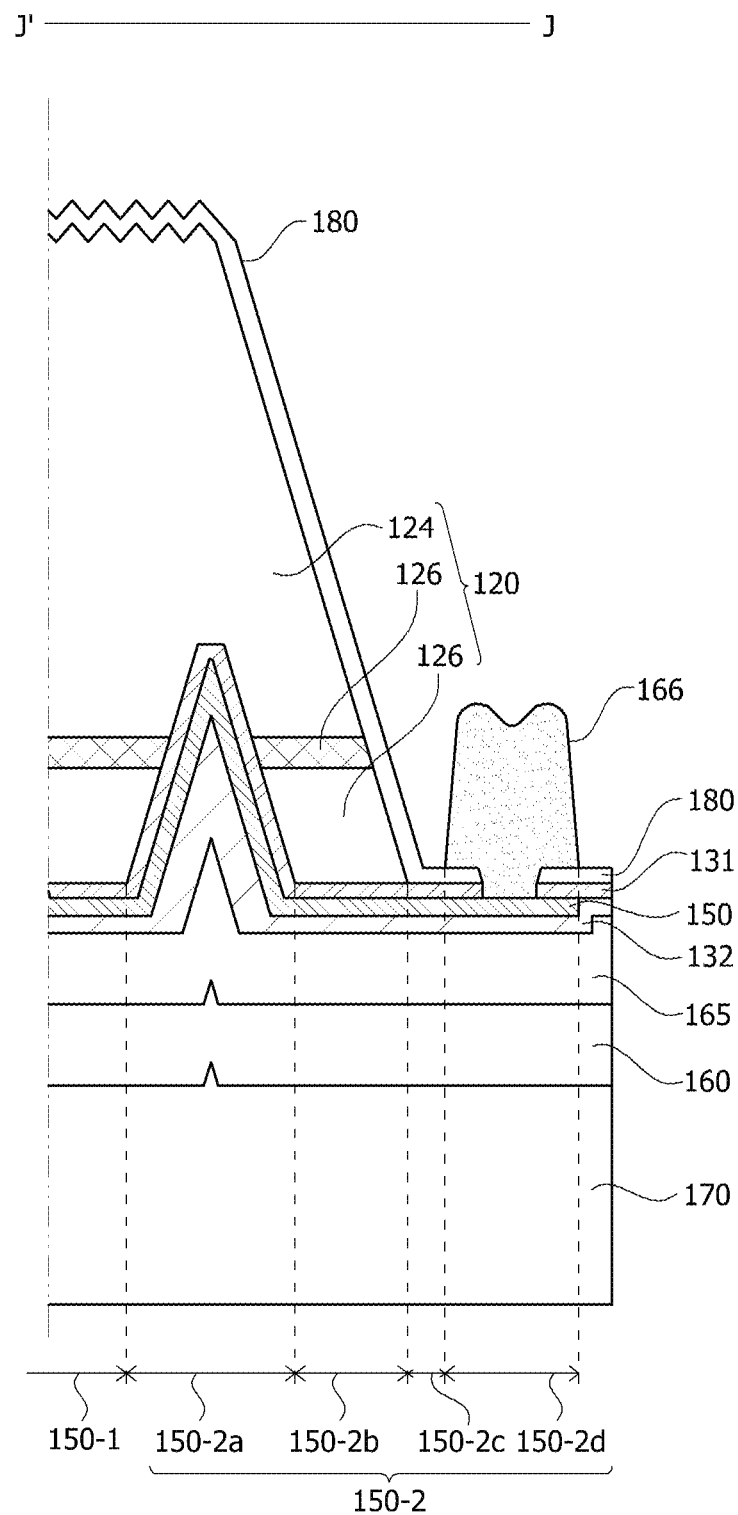
FIG. 7F is a cross-sectional view taken along line J-J' in FIG. 7E.

FIG. 7F is a cross-sectional view taken along line J-J' in FIG. 7E.

Referring to FIG. 7F, as described above, the second conductive layer 150 may have the first conductive region 150-1 and the second conductive region 150-2.

The second conductive region 150-2 may have a $(2\text{-}1)^{th}$ conductive region to a $(2\text{-}4)^{th}$ conductive region 150-2a to 150-2d.

First, the $(2\text{-}1)^{th}$ conductive region 150-2a may be disposed on the lower portion of the first recess 128 and may overlap the first recess 128 in the vertical direction. The $(2\text{-}1)^{th}$ conductive region 150-2a may be in contact with the first conductive region 150-1, may pass through the second-conductive-type semiconductor layer and the active layer in the semiconductor structure 120 along the first recess 128, and may be disposed in a partial region of the first-conductive-type semiconductor layer.

Specifically, the $(2\text{-}1)^{th}$ conductive region 150-2a may be disposed on the lower portion of the first recess 128 along a first bottom surface (f1 in FIG. 1) and first to sixth side surfaces (f2 to f7 in FIG. 1).

The $(2\text{-}2)^{th}$ conductive region 150-2b may be in contact with the $(2\text{-}1)^{th}$ conductive region 150-2a and may extend from the $(2\text{-}1)^{th}$ conductive region 150-2a to the electrode pad 166. Specifically, the $(2\text{-}2)^{th}$ conductive region 150-2b may be disposed up to the outermost surface of the semiconductor structure 120.

The $(2\text{-}3)^{th}$ conductive region 150-2c may be in contact with the $(2\text{-}2)^{th}$ conductive region 150-2b and may extend from the $(2\text{-}2)^{th}$ conductive region 150-2b to the electrode pad 166. Thus, the $(2\text{-}3)^{th}$ conductive region 150-2c may not overlap the electrode pad 166 in the vertical direction.

The $(2\text{-}4)^{th}$ conductive region 150-2d may be in contact with the $(2\text{-}3)^{th}$ conductive region 150-2c and may be disposed between the outer surface of the substrate 170 and the outer surface 166b of the electrode pad 166 from the $(2\text{-}3)^{th}$ conductive region 150-2c. The $(2\text{-}4)^{th}$ conductive region 150-2d may be disposed so as to overlap the electrode pad 166 in the vertical direction and to be electrically connected to the electrode pad 166 so that the $(2\text{-}4)^{th}$ conductive region 150-2d may extend so as to be disposed inward with respect to the outer surface 166b of the electrode pad 166. The $(2\text{-}4)^{th}$ conductive region 150-2d may be disposed inside the outer surface of the substrate 170 and thus may not be exposed to the outside. Therefore, oxidation and the like can be prevented, thereby improving reliability of the semiconductor device.

Figure 8A:
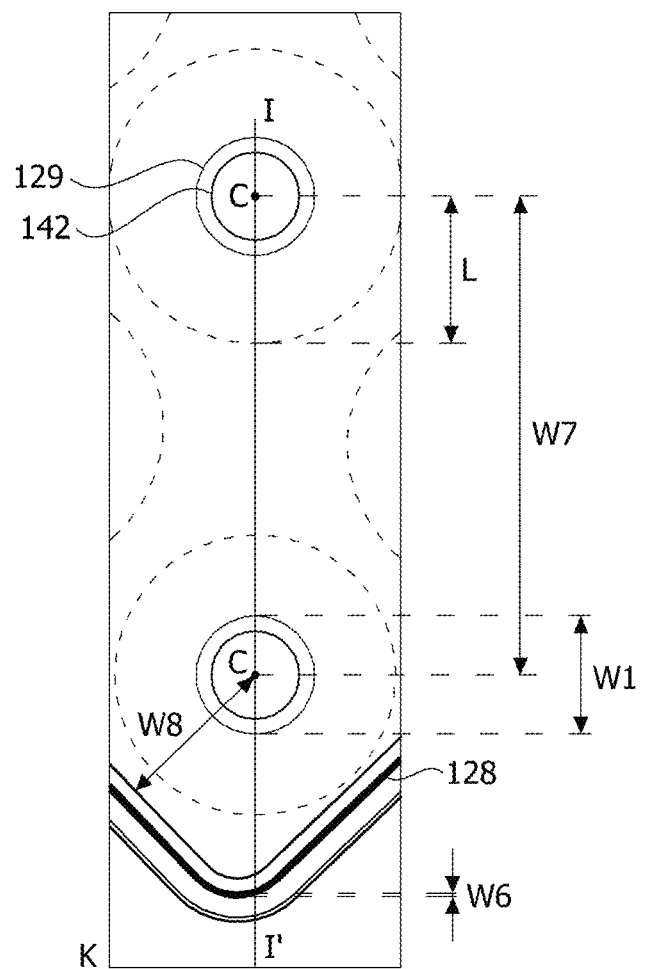
FIG. 8A is an enlarged view of portion K in FIG. 7C.
Figure 8B:
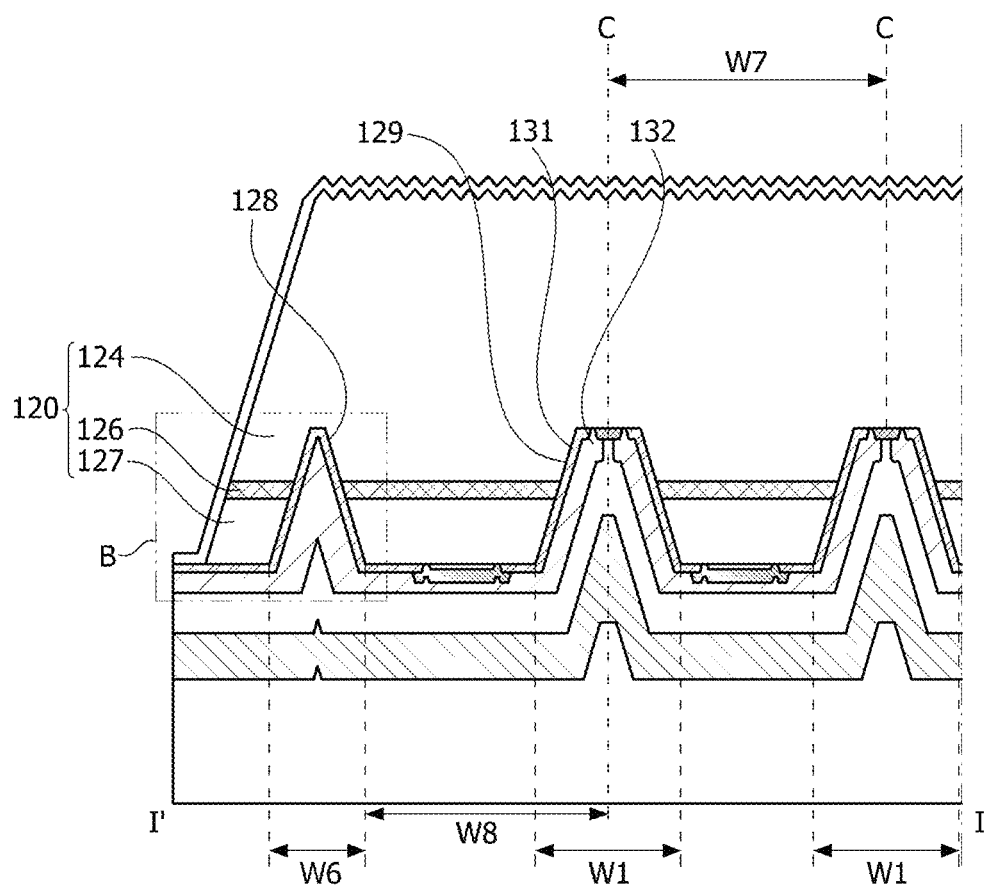
FIG. 8B is a cross-sectional view taken along line I-I' in FIG. 7C.
Figure 8C:
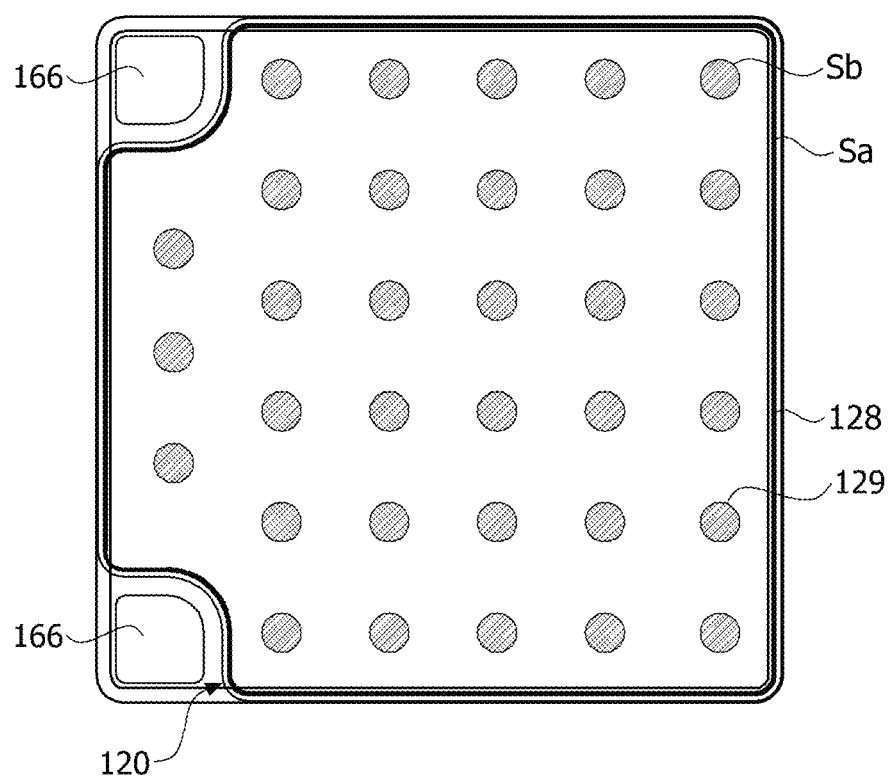
FIG. 8C is a plan view illustrating a first recess and a second recess.

FIG. 8A is an enlarged view of portion K in FIG. 7C, FIG. 8B is a cross-sectional view taken along line I-I' in FIG. 7C, and FIG. 8C is a plan view illustrating the first recess 128 and the second recess 129.

First, referring to FIGS. 8A and 8B, a minimum width W6 of the first recess 128 may be smaller than a minimum width W1 of the second recess 129. Specifically, a ratio of the minimum width W6 of the first recess 128 to the minimum width W1 of the second recess 129 may be in a range of 1:5 to 1:19.

When the ratio of the minimum width W6 of the first recess 128 to the minimum width W1 of the second recess 129 is less than 1:5, there is a limitation in that oxidation by exfoliation is facilitated. When the ratio of the minimum width W6 of the first recess 128 to the minimum width W1 of the second recess 129 is greater than 1:19, the number of the second recesses 129 for current spreading is decreased to lower light output.

In addition, as described above, the second recess 129 may have the center C. For example, when the second recess 129 has a circular shape, the center C may be a center of a circle. The center C of the second recess 129 may be the same as a center of the first electrode 142. A distance L to a boundary place having a current density of 40% or less of current density of the center of the first electrode 142 may be less than a width W7 between the centers C of the adjacent second recesses 129. Specifically, the width W7 between the centers C of the adjacent second recesses 129 may be at least two times the distance L to the boundary place. Due to such a configuration, a current injection can be easily performed, thereby improving light output.

In addition, a minimum width W8 between the second recess 129 nearest to the first recess 128 and the first recess 128 may be greater than the distance L to the boundary place. Since the first recess 128 is disposed so as not to interrupt spreading of a current injected through the second recess 129, even when the semiconductor device has the first recess 128, light output may not be decreased.

Referring to FIG. 8C, a ratio of an area Sa of the first recess 128 to an area Sb of the second recess 129 may be in a range of 1:6 to 1:10. When the ratio is less than 1:6, a ratio of the semiconductor device occupied by the second recess 129 is decreased to decrease light output. In addition, when the ratio is greater than 1:10, a maximum width of the first recess 128 is decreased to increase a mesa angle during etching, and thus manufacture is difficult and a stepped portion is increased.

Figure 9:
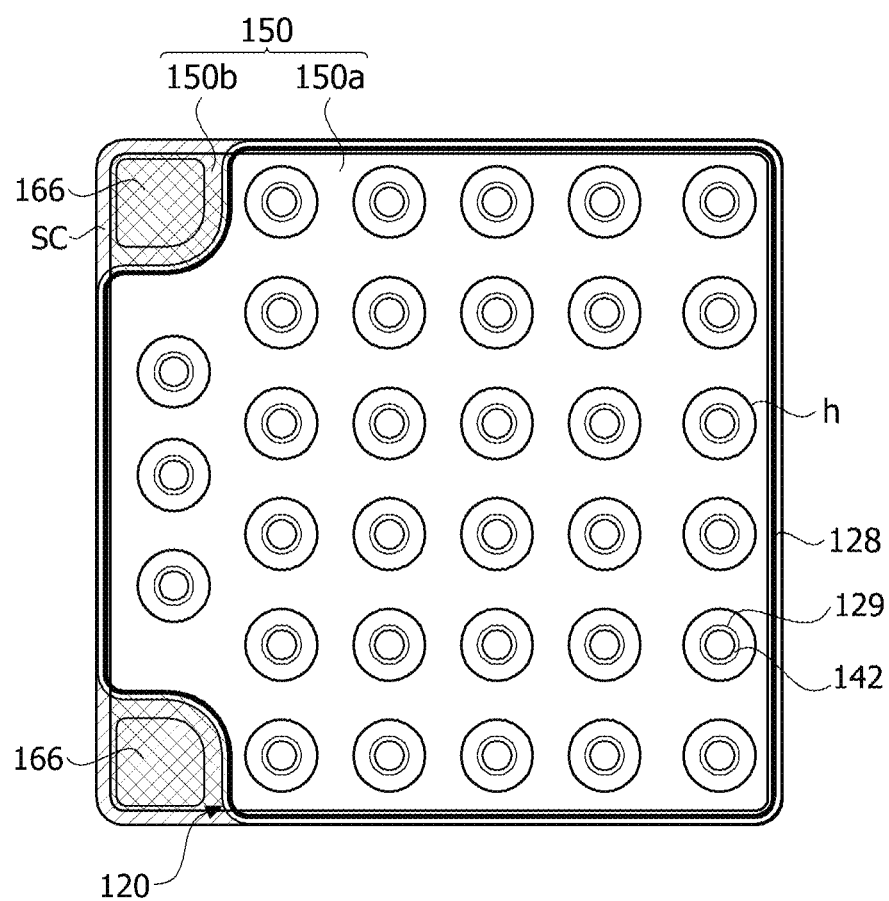
FIG. 9 is a plan view illustrating a second conductive layer 150 disposed inside a semiconductor device.

FIG. 9 is a plan view illustrating a second conductive layer 150 disposed inside a semiconductor device.

Referring to FIG. 9, the second conductive layer 150 may include a first sub-conductive layer 150a and a second sub-conductive layer 150b. Here, the first sub-conductive layer 150a may be a region overlapping a semiconductor structure 120 in a thickness direction thereof in the second conductive layer 150, and the second sub-conductive layer 150b may be a region excluding the first sub-conductive layer 150b and may overlap an electrode pad 166.

Specifically, the second conductive layer 150 may include a plurality of holes h so as not to be electrically connected to a first electrode 142 in a second recess 129. A maximum width of the plurality of holes h may be greater than that of the second recess 129, but the present invention is not limited to such a structure.

As described above, the conductive layer 150 may be electrically connected to the electrode pad 166 through the second sub-conductive layer 150b which does not overlap the semiconductor structure 120 in the thickness direction. That is, the second sub-conductive layer 150b may extend from the first sub-conductive layer 150a to the electrode pad 166.

In addition, the second conductive layer 150 may have a structure extending toward an outer surface of the semiconductor device. Therefore, an outermost surface of the second conductive layer 150 may be disposed between a first recess 128 and an outermost surface of the semiconductor device. In this case, the second conductive layer 150 may compensate for a mesa stepped portion formed by the first recess 128.

The second conductive layer 150 may be etched so as to be exposed at the outer surface of the semiconductor device. In this case, a ratio of an area of the second sub-conductive layer 150b and an area of a region Sc may be in a range of 1:2 to 1:4, the region Sc indicating a region in which a semiconductor structure is not disposed in the semiconductor device. When the ratio is less than 1:2, a risk of making contact with external contaminants or the like is increased because the second sub-conductive layer 150b approaches the outer surface of the semiconductor device. When the ratio is greater than 1:4, an area of the semiconductor structure is decreased in the semiconductor device, and thus, light output relative to an area of a chip is decreased.

Figure 10A:
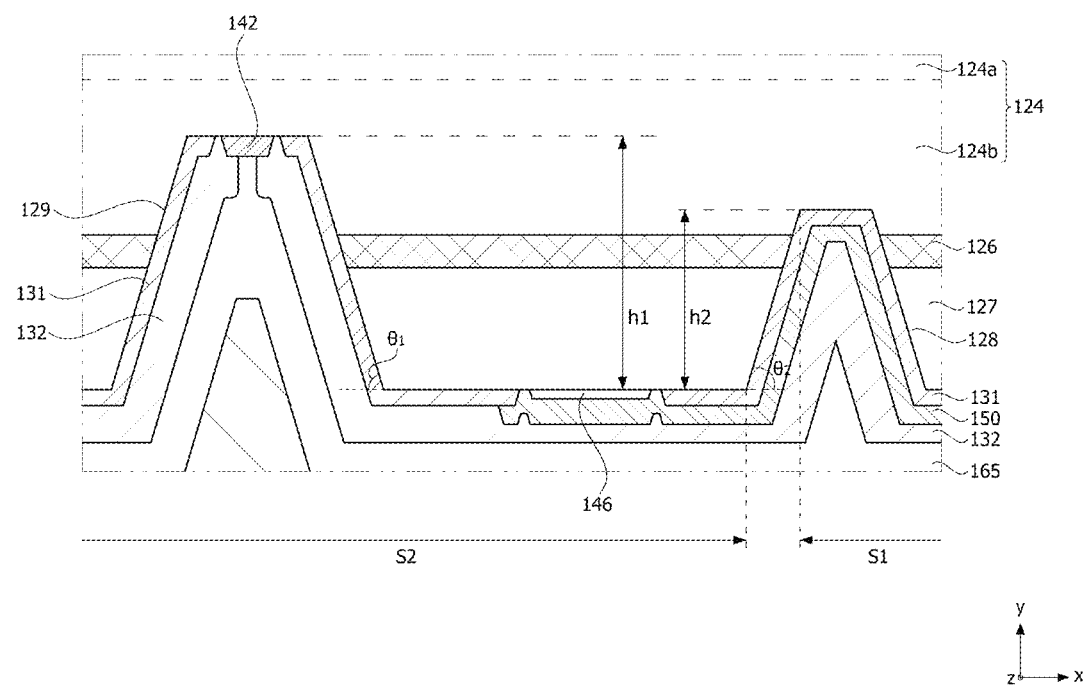
FIGS. 10A and 10B are views illustrating modified examples of FIG. 2.
Figure 10B:
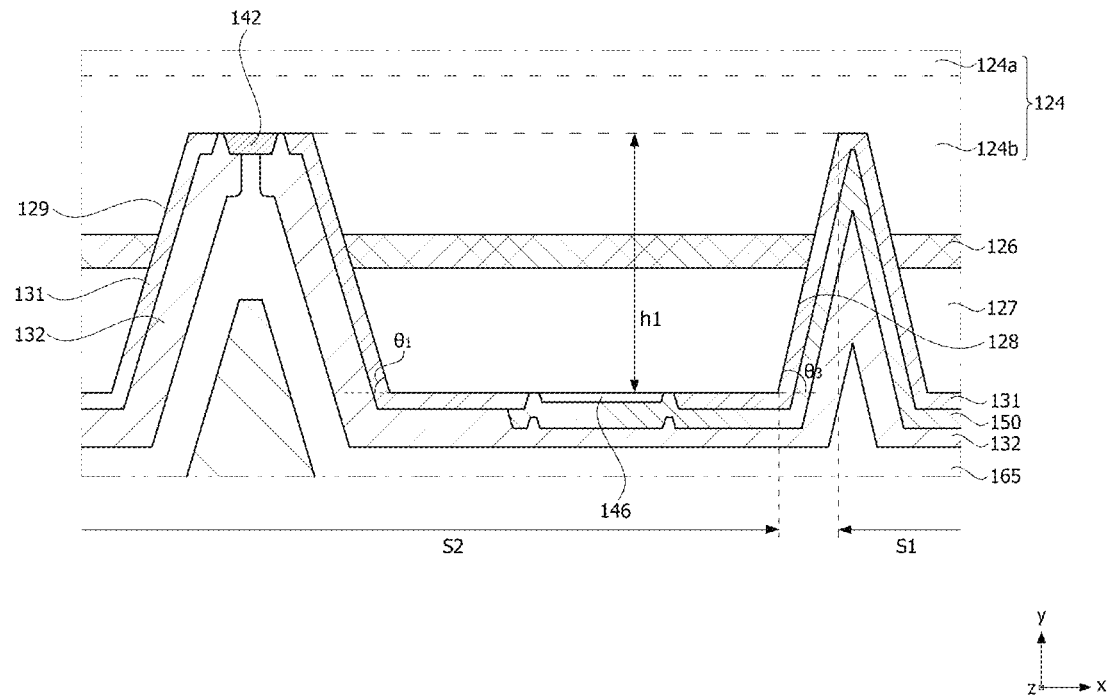

FIG. 10A to 10B are views illustrating modified examples of FIG. 2.

Referring to FIG. 10A, a minimum length h1 of a second recess 129 in a vertical direction may be different from a minimum length h2 of a first recess 128 in the vertical direction. For example, the minimum length h1 of the second recess 129 in the vertical direction may be greater than the minimum length h2 of the first recess 128 in the vertical direction. Due to such a configuration, a crack due to etching or the like can be prevented in a semiconductor structure 120. An inclination angle θ1 of the second recess 129 may be the same as an inclination angle θ2 of the first recess 128. However, the present invention is not limited thereto.

Referring to FIG. 10B, a minimum length h1 of a second recess 129 in a vertical direction may be the same as a minimum length h1 of a first recess 128 in the vertical direction.

An inclination angle θ1 of the second recess 129 may be different from an inclination angle θ2 of the first recess 128. The inclination angle θ1 of the second recess 129 may be less than the inclination angle θ2 of the first recess 128. That is, a maximum width of the first recess 128 may be decreased.

Due to such a configuration, an area of an active layer 126 disposed between the first recess 128 and the second recess 129 nearest to the first recess 128 may be increased.

The present invention is not limited such a configuration. The minimum length of the second recess 129 in the vertical direction may be different from the minimum length of the first recess 128 in the vertical direction, and concurrently, the inclination angle of the second recess 129 may be different from the inclination angler of the first recess 128.

Figure 11:
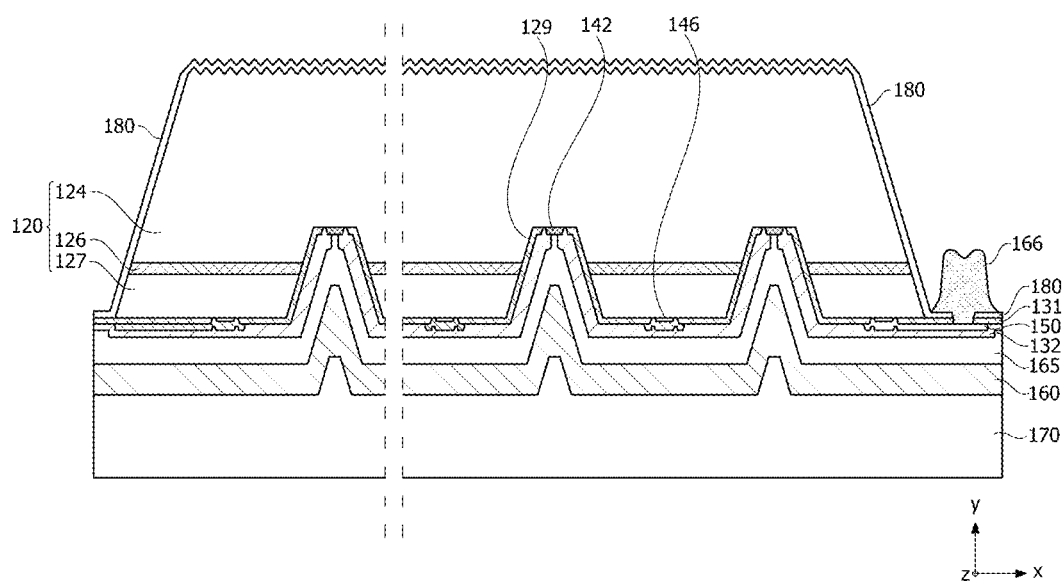
FIG. 11 is a conceptual view illustrating a semiconductor device in which a first recess does not exist.
Figure 12:
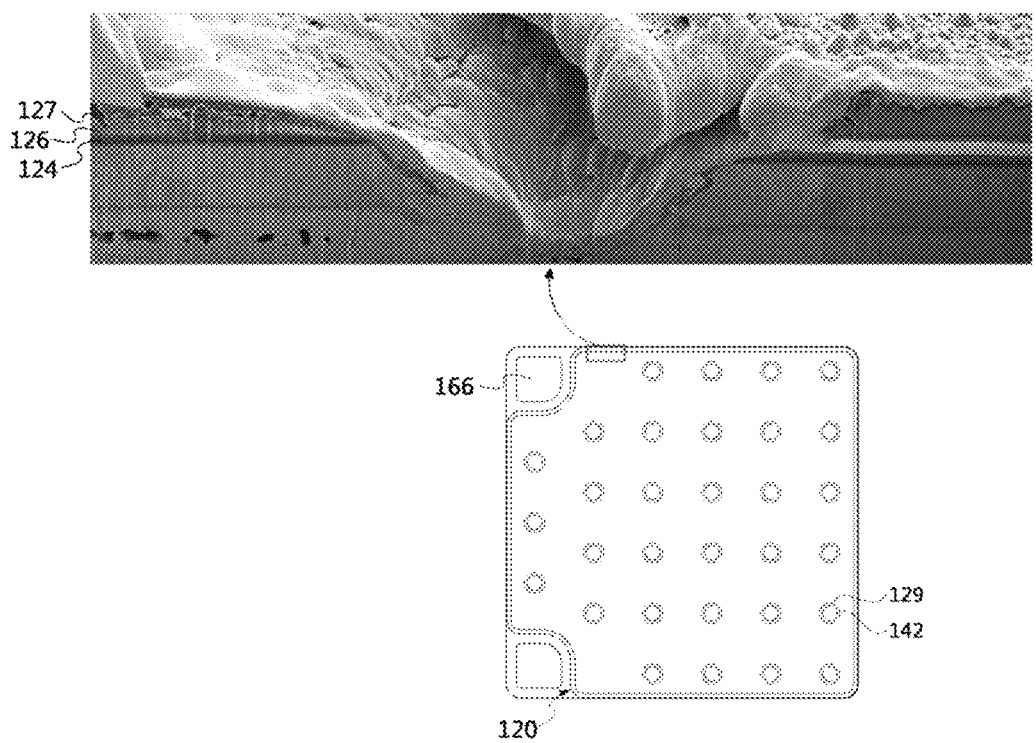
FIG. 12 is an image showing a reliability problem of the semiconductor device of FIG. 11.

FIG. 11 is a conceptual view illustrating a semiconductor device in which a first recess does not exist, and FIG. 12 is an image showing a reliability problem of the semiconductor device of FIG. 11.

Referring to FIG. 11, in the semiconductor device in which the first recess does not exist, a semiconductor structure 120 may have only a second recess 129. Thus, an active layer 126 may be spatially separated only by the second recess 129. In this case, a side surface of the semiconductor structure 120 may be surrounded only by a passivation layer 180, and the active layer 126 may be protected only by the passivation layer 180.

Referring to FIG. 12, when exfoliation is generated in the side surface of the semiconductor structure 120, the active layer 126 may be exposed, and the active layer 126 at the side surface may be oxidized due to permeation of external moisture and/or contaminants. In addition, oxidation may be easily propagated into the semiconductor structure 120. In this case, unlike the semiconductor device according to the exemplary embodiment, the active layer 126 in an effective emission region may be oxidized, resulting in a decrease in light output.

Figure 13:
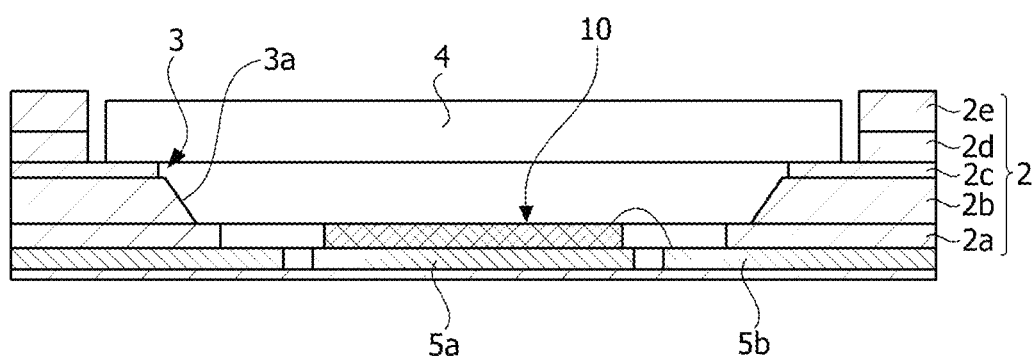
FIG. 13 is a conceptual view illustrating a semiconductor device package according to an exemplary embodiment of the present invention.
Figure 14:
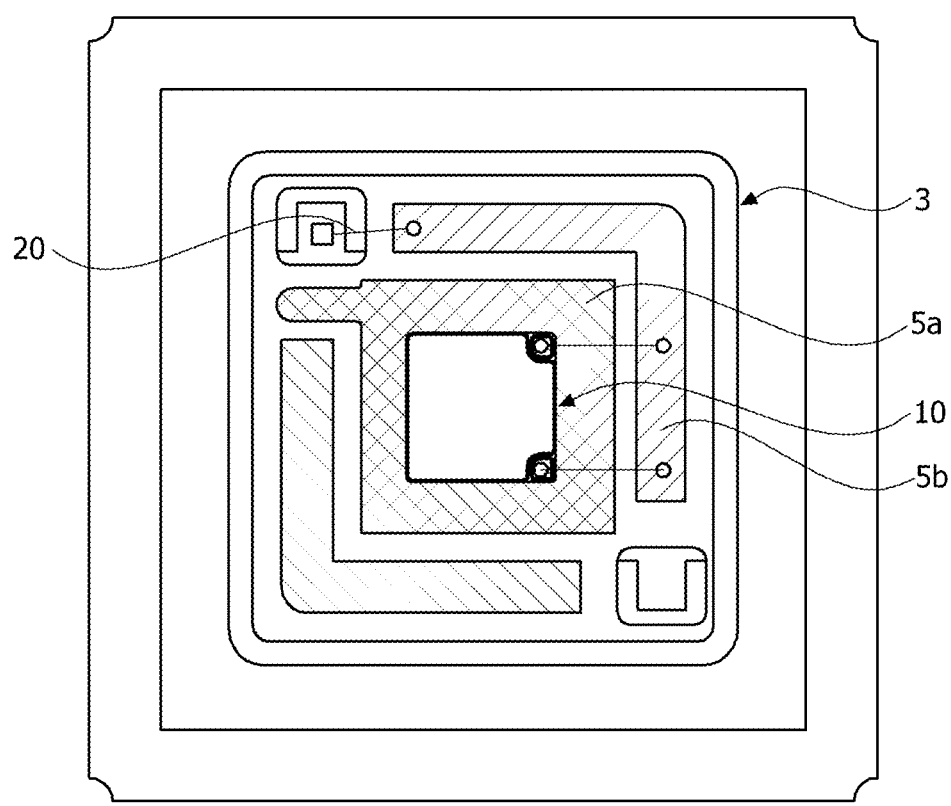
FIG. 14 is a plan view illustrating the semiconductor device package according to the exemplary embodiment of the present invention.

FIG. 13 is a conceptual view illustrating a semiconductor device package according to an exemplary embodiment of the present invention, and FIG. 14 is a plan view illustrating the semiconductor device package according to the exemplary embodiment of the present invention.

Referring to FIG. 13, the semiconductor device package includes a body 2 having a groove (opening) 3, a semiconductor device 10 disposed in the body 2, and a pair of lead frames 5a and 5b disposed in the body 2 and electrically connected to the semiconductor device 10. The semiconductor device 10 may include all of the elements described above.

The body 2 may include a material or a coating layer which reflects ultraviolet light. The body 2 may be formed by stacking a plurality of layers 2a, 2b, 2c, 2d, and 2e. The plurality of layers 2a, 2b, 2c, 2d, and 2e may include the same material or different materials. In an example, the plurality of layers 2a, 2b, 2c, 2d, and 2e may include an aluminum material.

The groove 3 may be formed to be wider as a distance from the semiconductor device is increased, and a stepped portion 3a may be formed on an inclined surface thereof.

A transparent layer 4 may cover the groove 3. The transparent layer 4 may be made of a glass material, but the present invention is not necessarily limited thereto. The transparent layer 4 is not particularly limited as long as a material is capable of effectively transmitting ultraviolet light. The groove 3 may be empty.

Referring to FIG. 14, the semiconductor device 10 is disposed on the first lead frame 5a and may be connected to the second lead frame 5b by a wire 20. In this case, the second lead frame 5b may be disposed to surround a side surface of the first lead frame 5a.

FIGS. 15A to 15J are flowcharts illustrating a manufacturing method of a semiconductor device of FIG. 1.

The manufacturing method of the semiconductor device according to the exemplary embodiment may include growing a semiconductor structure, disposing a first recess and a second recess, disposing a first insulating layer, a first electrode, and a second electrode, disposing a second conductive layer, disposing a second insulating layer, disposing a bonding layer, disposing a first conductive layer, and disposing a passivation layer and an electrode pad.

Figure 15A:
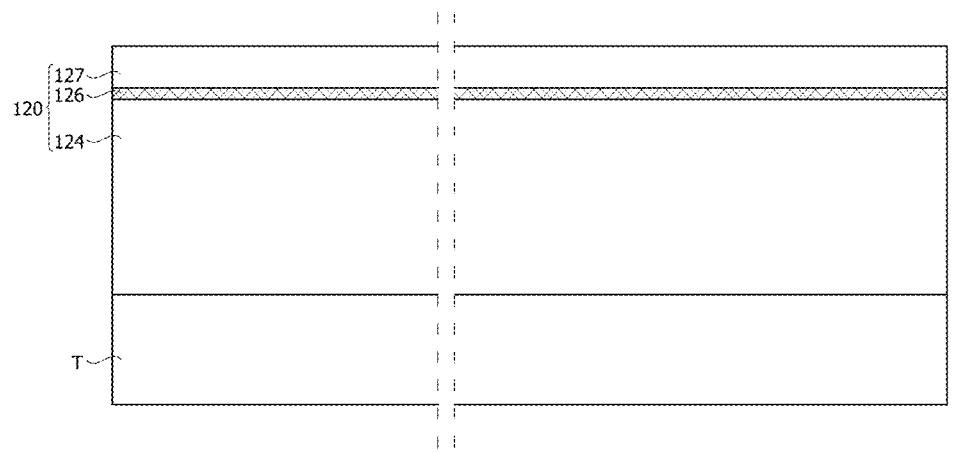
FIGS. 15A to 15J are flowcharts illustrating a manufacturing method of a semiconductor device of FIG. 1.

First, referring to FIG. 15A, a semiconductor structure 120 may be grown. The semiconductor structure 120 may be grown on a first temporary substrate T. For example, a first-conductive-type semiconductor layer 124, an active layer 126, and a second-conductive-type semiconductor layer 127 may be grown on the first temporary substrate T.

The first temporary substrate T may be a growth substrate. The first temporary substrate T may be made of at least one selected from sapphire ($Al_2O_3$), SiC, GaAs, GaN, ZnO, Si, GaP, InP, and Ge, but the present invention is not limited to such a type.

In addition, the semiconductor structure 120 may be formed using, for example, a metal organic chemical vapor deposition (MOCVD) method, a chemical vapor deposition (CVD) method, a plasma enhanced chemical vapor deposition (PECVD) method, a molecular beam epitaxy (MBE) method, a hydride vapor phase epitaxy (HVPE) method, or the like, but the present invention is not limited thereto.

Descriptions of the first-conductive-type semiconductor layer 124, the active layer 126, and the second-conductive-type semiconductor layer 127 may be the same as described above.

Figure 15B:
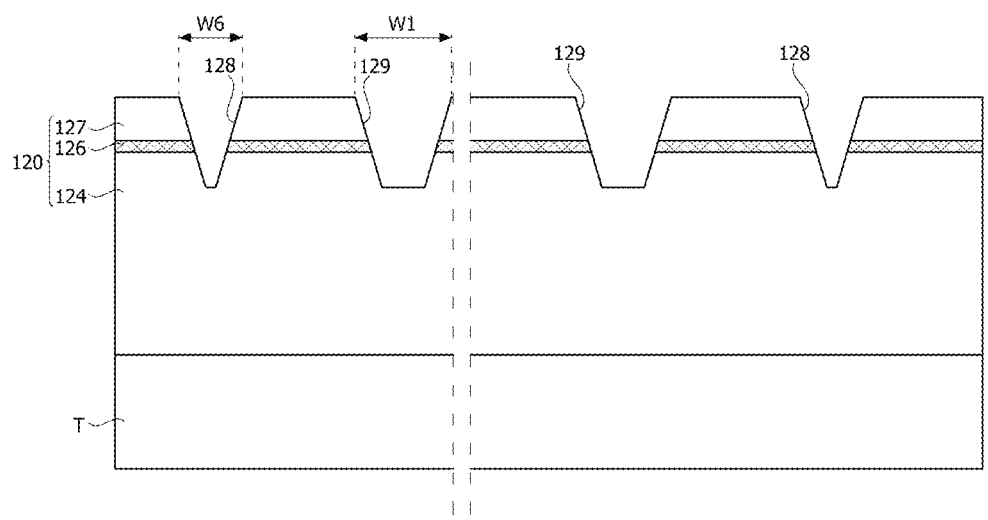

Referring to FIG. 15B, a first recess 128 and a second recess 129 may be formed. The first recess 128 may be disposed along an outer surface of the semiconductor structure 120. As described above, the active layer 126 may be separated into a first region and a second region by the first recess 128.

The second recess 129 may pass through the second-conductive-type semiconductor layer 127 and the active layer 126 in the semiconductor structure 120 and may be disposed in a partial region of the first-conductive-type semiconductor layer 124 as in the first recess 128. A plurality of second recesses 129 may be provided as shown in FIGS. 7A to 7B.

In addition, the second recess 129 may be formed simultaneously with the first recess 128 by etching. Thus, processes may be minimized. In addition, as described above, the first recess 128 and the second recess 129 may have the same inclination angle and the same thickness in a vertical direction. However, the first recess 128 and the second recess 129 may have different widths in a horizontal direction. For example, a minimum width W6 of the first recess 128 may be less than a minimum width W1 of the second recess 129.

Figure 15C:
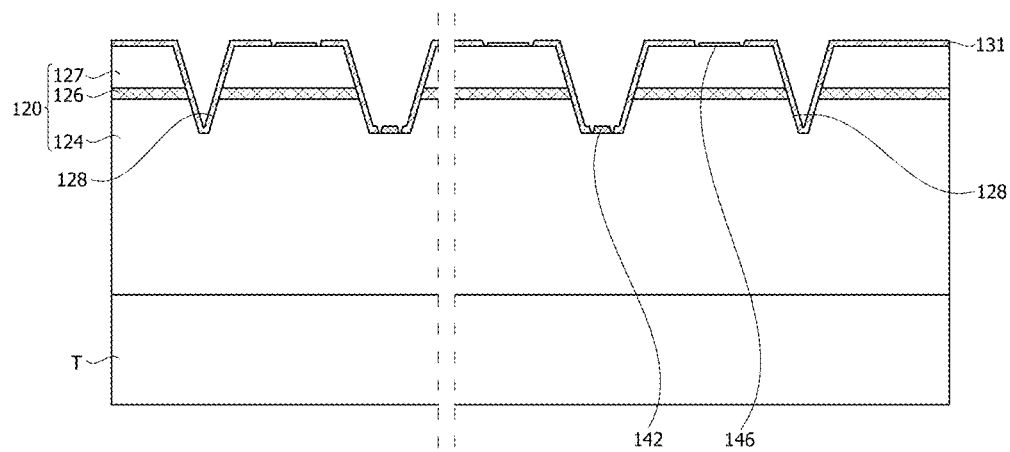

Referring to FIG. 15C, a first insulating layer 131, a first electrode 142, and a second electrode 146 may be provided. The first insulating layer 131 may be disposed and the first electrode 142 and the second electrode 146 may be disposed. The order of disposing may be various.

For example, the first insulating layer 131 may be disposed on an upper surface of the semiconductor structure 120, and a pattern may be formed at a position at which the first electrode 142 and the second electrode 146 are disposed. The first insulating layer 131 may be disposed on the first recess 128.

The first electrode 142 may be disposed on an upper surface of the first conductive-type semiconductor layer 124 and may be electrically connected to the first-conductive-type semiconductor layer 124. The second electrode 146 may be disposed on an upper surface of the first-conductive-type semiconductor layer 127 and may be electrically connected to the second-conductive-type semiconductor layer 127.

Figure 15D:
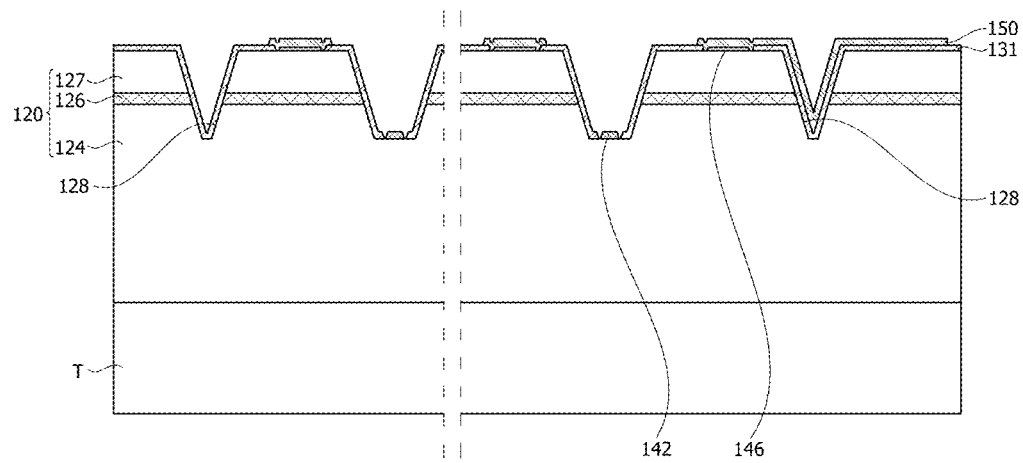

Referring to FIG. 15D, a second conductive layer 150 may be disposed on an upper surface of the first insulating layer 131. The second conductive layer 150 may be electrically connected to the second electrode 146. The first insulating layer 131 may electrically insulate the second conductive layer 150 and the first-conductive-type semiconductor layer 124 from each other. The second conductive layer 150 may be disposed on the first recess 128. In addition, the second conductive layer 150 may be etched so as not to be exposed at an outer surface of the semiconductor device.

Figure 15E:
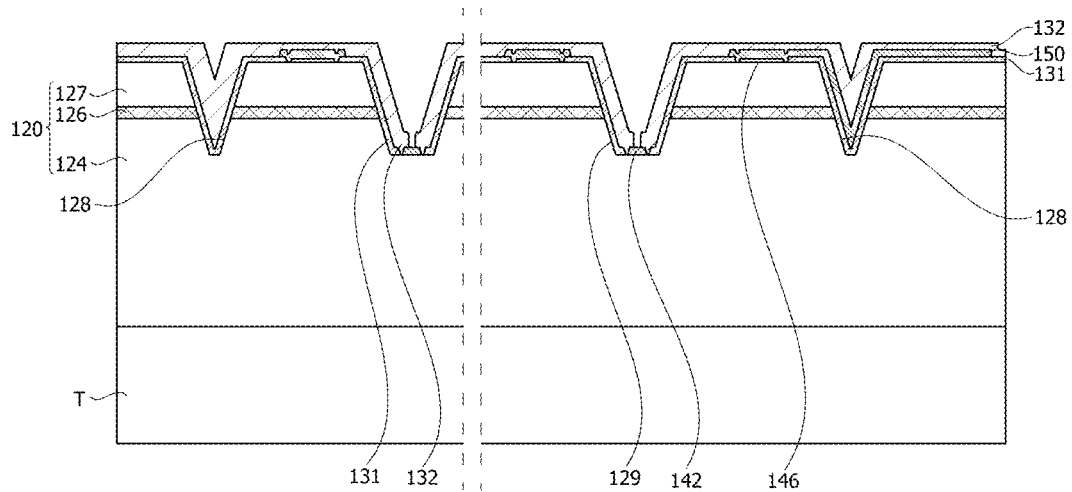

Referring to FIG. 15E, a second insulating layer 132 may be disposed on the semiconductor structure 120. The second insulating layer 132 may be disposed to surround the second conductive layer 150. In addition, the second insulating layer 132 may be disposed on the first insulating layer 131 so as to surround the first insulating layer 131. Thus, even when a crack is generated in the first insulating layer 131, the second insulating layer 132 may secondarily protect the semiconductor structure 120.

The second insulating layer 132 may be disposed on the second electrode 142. The second insulating layer 132 may be disposed to expose a portion of an upper surface of the first electrode 142.

Figure 15F:
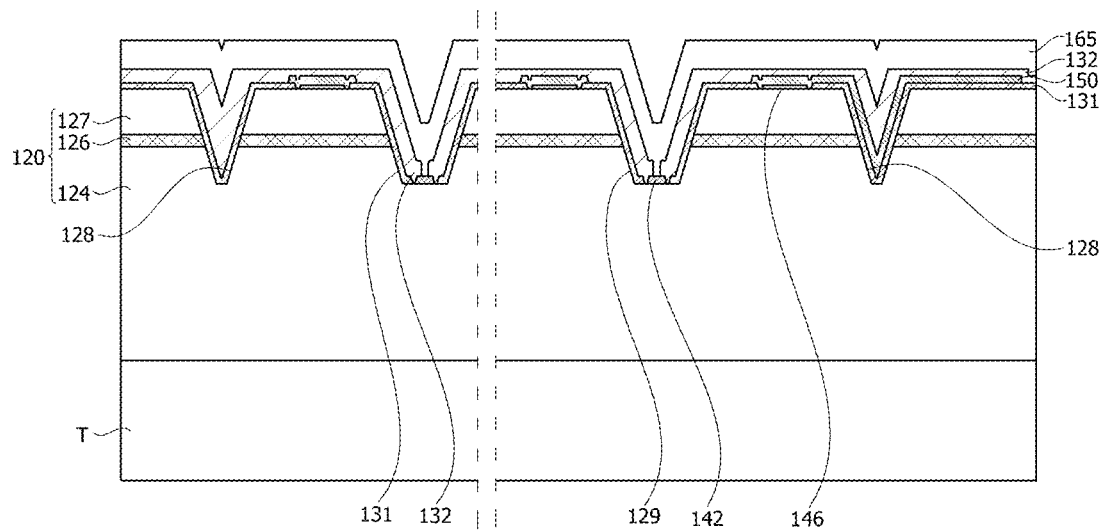

Referring to FIG. 15F, a first conductive layer 165 may be disposed on the second insulating layer 132. The first conductive layer 165 may be disposed on the exposed upper surface of the first electrode 142. Thus, the first conductive layer 165 may be electrically connected to the first electrode 142. The second insulating layer 132 may electrically insulate the second electrode 146 and the first conductive layer 165 from each other.

Figure 15G:
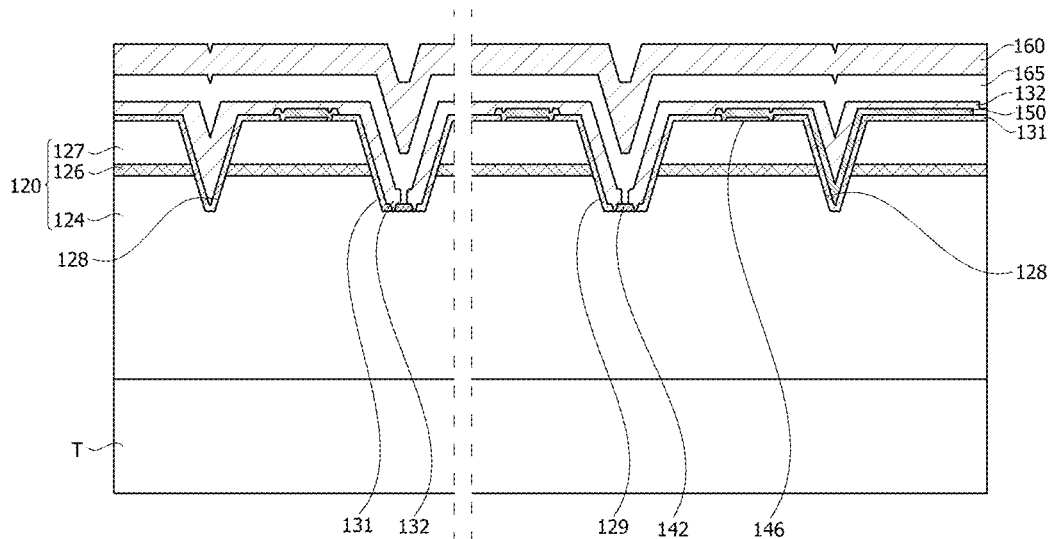

Referring to FIG. 15G, a bonding layer 160 may be disposed on the first conductive layer 165, and the boning layer 160 may include a conductive material. In an example, the bonding layer 160 may include a material selected from the group consisting of gold, tin, indium, aluminum, silicon, silver, nickel, copper, and alloys thereof.

Figure 15H:
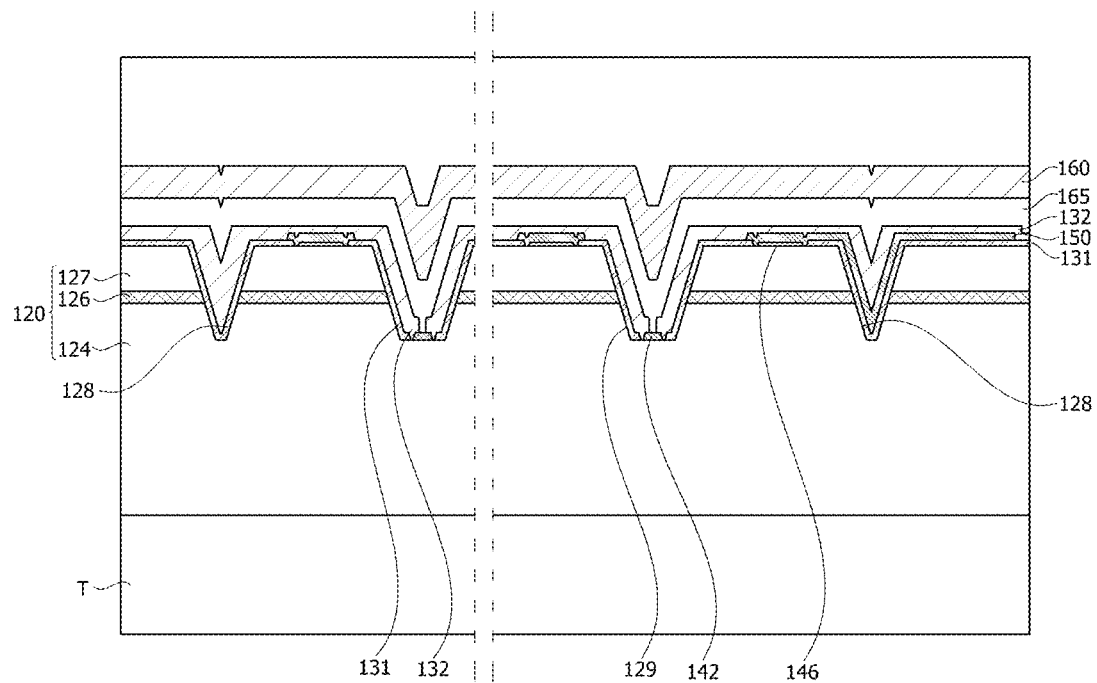

Referring to FIG. 15H, a second substrate T' may be disposed on the bonding layer 160. The second substrate T' may be the same as a substrate 170 in FIG. 1. As described with reference to FIG. 1, the second substrate T' may be made of a conductive material. In an example, the second substrate T' may include a metal or semiconductor material. The second substrate T' may include a metal having excellent electrical conductivity and/or thermal conductivity. In this case, heat generated during operation of the semiconductor device may be rapidly released to the outside. When the second substrate T' is made of a conductive material, the first electrode 142 may receive a current from the outside through the second substrate T'.

The second substrate T' may include a material selected from the group consisting of silicon, molybdenum, silicon, tungsten, copper, aluminum, and alloys thereof.

Figure 15I:
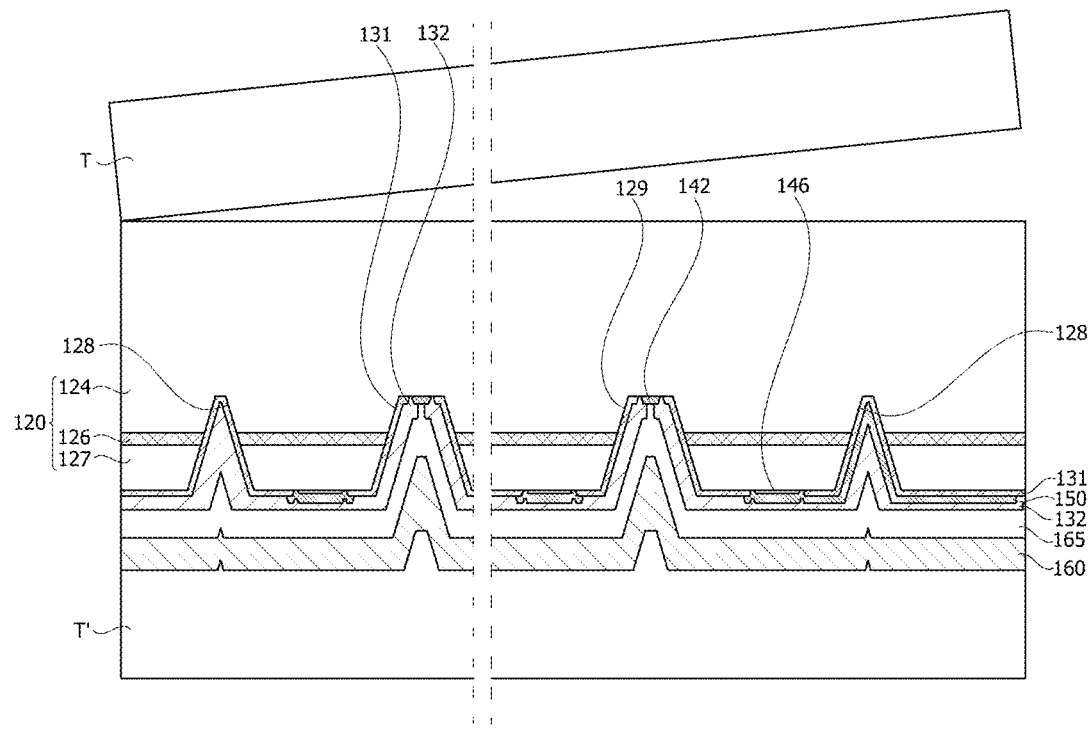
Figure 15J:
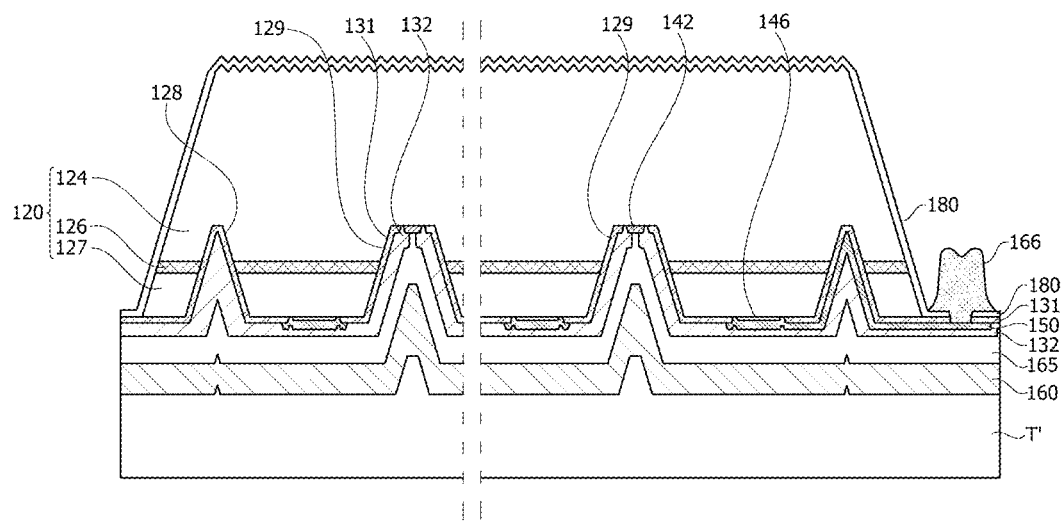

Referring to FIG. 15I, the first temporary substrate T may be separated from the semiconductor structure 120. For example, the semiconductor structure 120 and the first temporary substrate T may be separated by irradiating a laser onto the first temporary substrate T. However, the present invention is not limited to such a method.

Referring to 15J, a passivation layer 180 may be disposed on an upper surface and side surfaces of the semiconductor structure 120. As described above, the passivation layer 180 may have a thickness of 200 nm to 500 nm. When the thickness is 200 nm or more, a device may be protected from external moisture or foreign substances, thereby improving electrical and optical reliability of the device. When the thickness is 500 nm or less, it is possible to reduce stress applied to the semiconductor device, prevent a decrease in electrical and optical reliability of the semiconductor device, or reduce costs of the semiconductor device, which is caused by an increase in a process time of the semiconductor device. However, the present invention is not limited to such a configuration.

In addition, before the passivation layer 180 is disposed, uneven portions may be formed on an upper surface of the semiconductor structure 120. The uneven portions may improve extraction efficiency of light emitted from the semiconductor structure 120. Heights of the uneven portions may be differently adjusted according to a wavelength of light generated in the semiconductor structure 120. Further, an electrode pad 166 may be formed through a pattern.

As described with reference to FIG. 13, the semiconductor structure 120 may be disposed on a lead frame of the semiconductor device package or on a circuit pattern of a circuit board. The semiconductor device may be applied to various kinds of light source devices. In an example, the light source devices may include a sterilizing device, a curing device, a lighting device, and a display device, a vehicle lamp, and the like. That is, the semiconductor device may be applied to various electronic devices disposed in a case so as to provide light.

The sterilizing device may include the semiconductor device according to the exemplary embodiment to sterilize a desired area. The sterilizing device may be applied to household appliances such as a water purifier, an air conditioner, and a refrigerator, but the present invention is not necessarily limited thereto. That is, the sterilizing device may be applied to all various products (for example, medical devices) requiring sterilization.

In an example, the water purifier may include the sterilizing device according to an exemplary embodiment so as to sterilize circulating water. The sterilizing device may be disposed in a nozzle or an ejection port through which water circulates and may irradiate ultraviolet light. In this case, the sterilizing device may have a waterproof structure The curing apparatus may include the semiconductor device according to the exemplary embodiment in order to cure various liquids. Liquids may be the broadest concept that includes various materials which cure upon exposure to ultraviolet light. In an example, the curing device may cure various resins. The curing device may be applied to cure a cosmetic product such as a manicure.

The lighting device may include a substrate, a light source module including the semiconductor device according to the exemplary embodiments, a heat dissipater for dissipating heat of the light source module, and a power supply for processing or converting an electrical signal supplied from the outside and supplying the processed or converted electrical signal to the light source module. In addition, the lighting device may include a lamp, a head lamp, a street lamp, or the like.

The display device may include a bottom cover, a reflective plate, a light-emitting module, a light guide plate, an optical sheet, a display panel, an image signal output circuit, and a color filter. The bottom cover, the reflective plate, the light-emitting module, the light guide plate, and the optical sheet may constitute a backlight unit.

The reflective plate is disposed on the bottom cover, and the light-emitting module emits light. The light guide plate is disposed in front of the reflective plate and guides light emitted from the light-emitting module in a forward direction, and the optical sheet includes a prism sheet and the like and is disposed in front of the light guide plate. The display panel is disposed in front of the optical sheet, the image signal output circuit supplies an image signal to the display panel, and the color filter is disposed in front of the display.

When the semiconductor device is used as a backlight unit of a display device, the semiconductor device may be used as an edge-type backlight unit or as a direct-type backlight unit.

The semiconductor device may be a laser diode in addition to a light-emitting diode described above.

Like a light-emitting device, the laser diode may include a first conductive semiconductor layer, an active layer, and a second conductive semiconductor layer which have the above-described structure. Further, the laser diode uses an electro-luminescence phenomenon in which light is emitted when a current flows therein after a p-type first-conductive-type semiconductor and an n-type second conductive-type semiconductor are bonded, but the laser diode has directivity and a phase of light different from those of light emitted from the light-emitting device. That is, the laser diode may emit light having the same phase in the same direction at a specific single wavelength (i.e., a monochromatic beam) using a phenomenon referred to as stimulated emission and a constructive interference phenomenon, and, with the above-described characteristic, the laser diode may be used for optical communication, medical equipment, semiconductor processing equipment, and the like.

As an example of a light-receiving device, there is a photodetector, which is a kind of a transducer which detects light and converts intensity of the light into an electric signal. As the photodetector, there is a photovoltaic cell (silicon and selenium), an optical conversion device (cadmium sulfide and cadmium selenide), a photo diode (PD) (e.g., a PD having a peak wavelength in a visible blind spectral region or a true blind spectral region), a phototransistor, a photomultiplier tube, a phototube (e.g., a vacuum and gas-filled type), an infra-red (IR) detector, and the like, but the embodiments are not limited thereto.

Further, a semiconductor device such as the photodetector may be manufactured using a direct bandgap semiconductor which generally has superior photo-conversion efficiency. Alternatively, the photodetector may have a variety of structures, including a pin-type photodetector using a p-n junction, which is the most general structure, a Schottky photodetector using a Schottky junction, and a metal-semiconductor-metal (MSM) type photodetector.

Like the light-emitting device, the PD may include a first conductive semiconductor layer, an active layer, and a second conductive semiconductor layer which have the above-described structure, and the PD may be configured with a p-n junction or a pin structure. The PD is operated by applying a reverse bias or a zero bias, and, when light enters the PD, electrons and holes are generated such that a current flows. At this point, a magnitude of the current may be approximately proportional to intensity of the light which is incident on the PD.

A photovoltaic cell or a solar cell is a kind of PD and may convert light into a current. Like the light-emitting device, the solar cell may include a first conductive semiconductor layer, an active layer, and a second conductive semiconductor layer which have the above-described structure.

Further, the PD may be used as a rectifier of an electronic circuit through a rectifying characteristic of a general diode using a p-n junction, and the PD may be applied to an oscillation circuit and the like by being employed as a microwave circuit.

In addition, the above-described semiconductor device is not necessarily implemented with only a semiconductor and may further include a metal material in some cases. For example, the semiconductor device such as the light-receiving device may be implemented using at least one among Ag, Al, Au, In, Ga, N, Zn, Se, P, and As, or a semiconductor material which is doped with a p-type or n-type dopant or an intrinsic semiconductor material.

According to an exemplary embodiment, it is possible to manufacture a semiconductor device having improved reliability by blocking external moisture or other contaminants from entering an emission region of a semiconductor device.

In addition, it is possible to manufacture a semiconductor device having excellent optical output and operating voltage characteristics.

According to an exemplary embodiment, a semiconductor device can be implemented in a vertical type. However, the present invention is not limited thereto, and the semiconductor device can be implemented in a flip-chip type.

The various and advantageous advantages and effects of the present invention are not limited to the above description and may be more easily understood in the course of describing a specific exemplary embodiment of the present invention.

While the present invention has been mainly described with reference to the exemplary embodiments, and it should be understood that the present invention is not limited to the disclosed exemplary embodiments, and that various modifications and applications can be devised by those skilled in the art without departing from the gist of the present invention. For example, each component specifically shown in the exemplary embodiment can be modified and implemented. Differences related to these modifications and applications should be construed as being within the scope of the present invention defined by the appended claims.

What is claimed is:

1. A semiconductor device comprising:
a substrate having a plurality of side surfaces extending in different directions;
a semiconductor structure disposed on the substrate and including a first-conductive-type semiconductor layer, a second-conductive-type semiconductor layer, an active layer disposed between the first-conductive-type semiconductor layer and the second-conductive-type semiconductor layer, a first recess passing through the second conductive-type semiconductor layer, the active layer, and a first portion of the first conductive type semiconductor layer, and a plurality of second recesses passing through the second conductive type semiconductor layer, the active layer and a second portion of the first conductive type semiconductor layer;
an electrode pad disposed on the substrate and spaced apart from the semiconductor structure;
a first electrode electrically connected to the first conductive type semiconductor layer;
a second electrode electrically connected to the second conductive type semiconductor layer;
a second conductive layer disposed between the semiconductor structure and the substrate,
a first insulation layer disposed in the first recess; and
a second insulation layer disposed in each of the plurality of second recesses;
wherein the second insulation layer includes a plurality of openings, each opening provided at a different one of the plurality of second recesses,
wherein the first electrode includes a plurality of protrusion electrodes, each protrusion electrode disposed in a different one of the plurality of openings,
wherein the second electrode extends to the electrode pad, and electrically contacts the electrode pad,
wherein the first recess surrounds the plurality of second recesses in a closed-loop shape,
wherein the first insulation layer is in contact with side surface of the active layer and an entire bottom surface of the first conductive type semiconductor layer in the first recess, and
wherein the active layer is severed by the first recess.

2. The semiconductor device of claim 1,
wherein the second electrode extends outside the semiconductor structure through the first recess,
wherein the first recess is disposed along an outer surface of the semiconductor structure, and
wherein a maximum length of the second recess in a vertical direction is different from a maximum length of the first recess in the vertical direction.

3. The semiconductor device of claim 2, wherein a ratio of an area of the first recess to an area of the second recess is in a range of 1:6 to 1:10.

4. The semiconductor device of claim 1, wherein:
the second conductive layer has a first conductive region disposed inside the first recess and a second conductive region extending from the first conductive region to the electrode pad,
the first conductive region is surrounded by the first recess, and
the second conductive region extend from the first conductive region to outside the semiconductor structure.

5. The semiconductor device of claim 4,
wherein the first conductive region is disposed inside first and second edge surfaces of the semiconductor structure,
the first edge surface extending along a side surface of the substrate, and
the second edge surface extending along an inner surface of the electrode pad.

6. The semiconductor device of claim 4,
wherein a portion of the second conductive region is disposed between first and second edge surfaces of the semiconductor structure and an outer surface of the substrate,
the first edge surface extending along a side surface of the substrate, and
the second edge surface extending along an inner surface of the electrode pad.

7. The semiconductor device of claim 1,
a partial region of a first edge surface of the semiconductor structure have a curved shape, the first edge surface extending along a side surface of the substrate.

8. The semiconductor device of claim 1,
wherein a ratio of a maximum area of the semiconductor structure to an area of the first recess is in a range of 1:0.01 to 1:0.03.

9. The semiconductor device of claim 1, wherein a maximum separation distance between the first recess and an outer surface of the semiconductor structure is in a range of 3 μm to 5 μm.

* * * * *